(12) United States Patent
Blain et al.

(10) Patent No.: US 8,983,808 B2
(45) Date of Patent: Mar. 17, 2015

(54) AUTOMATED MESH GENERATION AND EDITING TOOLS

(75) Inventors: Cheryl A. Blain, Slidell, LA (US); Robert S. Linzell, Carriere, MS (US); Thomas C. Massey, Clinton, MS (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 685 days.

(21) Appl. No.: 12/574,880

(22) Filed: Oct. 7, 2009

(65) Prior Publication Data

US 2010/0094597 A1     Apr. 15, 2010

Related U.S. Application Data

(60) Provisional application No. 61/105,448, filed on Oct. 15, 2008.

(51) Int. Cl.
    *G06F 7/60*           (2006.01)
    *G06F 17/10*         (2006.01)
                   (Continued)

(52) U.S. Cl.
    CPC .......... *G06T 17/20* (2013.01); *G06F 17/5009* (2013.01); *G06F 17/5018* (2013.01); *G01V 99/005* (2013.01)
    USPC ...................................... 703/2; 703/5; 703/9

(58) Field of Classification Search
    CPC ............ G06F 17/5009; G06F 17/5018; G06V 99/005
    USPC .................................... 703/2, 5, 9
    See application file for complete search history.

(56) References Cited

U.S. PATENT DOCUMENTS 6,411,406 B1    6/2002    Kreuzer
6,718,346 B1    4/2004    Brown
(Continued)

OTHER PUBLICATIONS

Chapter 3, NPL Publication "Chapter 3 fort.14 File Domain Mesh", Aug. 28, 2007.*

(Continued)

*Primary Examiner* — Omar Fernandez Rivas
*Assistant Examiner* — Angel Calle
(74) *Attorney, Agent, or Firm* — US Naval Research Laboratory; Kathleen Chapman; Joslyn J. Barritt

(57) ABSTRACT

Mesh generation and editing tools are provided. The mesh generation and editing tools can be implemented using MATLAB® and are platform-independent, usable in any number of different operating systems and configurations. The mesh generation tool uses a graphical user interface to receive user inputs of boundary and bathymetry information and automatically generates a mesh based on the input information and user selections of the number of mesh refinements based on the bathymetry that should be run. The mesh generation tool also performs a check of the computing resources needed to construct a mesh with the selected parameters and allows the user to change the parameters before generating the mesh if necessary to avoid excessive resource use. The mesh editing tool includes a fully automated master smoothing script that applies a set of "best practices" mesh operations to a mesh, and further includes a set of mesh editing tools that can be applied individually to edit and refine a mesh to best suit a user's needs. Meshes generated in accordance with the present invention can include properly formatted ADCIRC grid files (fort.14 file) that can be used to represent coastal ocean dynamics in a discrete computational framework.

9 Claims, 25 Drawing Sheets

(51) Int. Cl.
- G06G 7/48 (2006.01)
- G06G 7/56 (2006.01)
- G06G 7/50 (2006.01)
- G06T 17/20 (2006.01)
- G06F 17/50 (2006.01)
- G01V 99/00 (2009.01)

(56) References Cited

U.S. PATENT DOCUMENTS

| | | | |
|---|---|---|---|
| 6,964,010 | B1 | 11/2005 | Sharp |
| 7,239,311 | B2 | 7/2007 | Dunn et al. |
| 7,463,258 | B1 * | 12/2008 | Drury et al. ............... 345/423 |
| 7,523,391 | B1 | 4/2009 | Eizenhoefer |
| 7,620,536 | B2 | 11/2009 | Chow |
| 8,112,455 | B2 | 2/2012 | Blain et al. |
| 8,438,467 | B2 | 5/2013 | Blain |
| 2004/0122596 | A1 | 6/2004 | Sudhakar |
| 2005/0143909 | A1 | 6/2005 | Orwant |
| 2006/0020563 | A1 | 1/2006 | Coleman et al. |
| 2007/0185653 | A1 | 8/2007 | Bresch |
| 2008/0170791 | A1 * | 7/2008 | Eskildsen et al. ........... 382/199 |
| 2009/0232377 | A1 | 9/2009 | Miao |
| 2010/0094597 | A1 | 4/2010 | Blain |
| 2010/0131575 | A1 | 5/2010 | Blain et al. |
| 2010/0131879 | A1 | 5/2010 | Blain et al. |
| 2010/0226589 | A1 * | 9/2010 | Mukherjee ................ 382/264 |
| 2012/0150918 | A1 | 6/2012 | Blain et al. |

OTHER PUBLICATIONS

Cameron L. McDonald, NPL Publication "Automatic, Unstructured mesh generation for 2D shelf-based tidal models", Dec. 2006.*

Cheryl Ann Blain, "MeshGUI, a mesh generation and editing toolset ser for ADCIRC model", Feb. 8, 2008.*

Ata Bilgili, "Battri 2-D triangular grid generator", version 11.11.03, Nov. 14, 2003.*

Ata Bilgili, "Battri: A two-dimensional bathymetry based unstructured triangular grid generator for finite element circulation modeling", Sep. 2005.*

E Di Lorenzo, "ROMS Tutorials", Feb. 2008.*

U.S. Appl. No. 61/105,448, filed Oct. 15, 2008, Unstructured Grid Coastal Modeling Tools, Cheryl Ann Blain, et al.

Notice of Allowance, U.S. Appl. No. 12/579,112, dated Sep. 22, 2011.

Makef15:An ADCIRC Model Fort.15, Input File Creation GUI for Parameter Specification and Periodic Boundary Forcing; NRL/MR/7320-079081; Naval Research Laboratory, Cheryl Ann Blain, Robert S. Linzell, Dec. 7, 2007.

Makef22:An ADCIRC Model Fort.22, Input File Creation Tool for Surface, Wind and Pressure Forcing, NRL/MR/7320-07-9082, Naval Research Laboratory, Cheryl Ann Blain, Robert S. Linzell, Brett Estrade, Dec. 7, 2007.

MeshGUI: A Mesh Generation and Editing Toolset for the ADCIRC Model, NRL/MR/7322-08-9083, Naval Research Laboratory, Cheryl Ann Blain, Robert S. Linzell, T. Chris Massey, Feb. 8, 2008.

Notice of Allowance, U.S. Appl. No. 13/332,992, System and Method for Providing Structured Data to a structured or unstructured grid, Cheryl Ann Blain, et al, filed Dec. 21, 2011, mail date Nov. 4, 2013.

Luettich, et al, ADCIRC: An Advanced three-Dimensional Circulation Model for Shelves, Coasts and Estuaries, Report 1 Theory and Methodology of ADCIRC-2DDI and ADCIRC-3DL Coastal Engineering Research Center, Department of the Army, Nov. 1992. (in Notice of References Cited for U.S. Appl. No. 13/332,992).

Westerink, et al, ADCIRC: An Advanced three-Dimensional Circulation Model for Shelves, Coasts and Estuaries, Report 2, User's Manual for ADCIRC-2DDI, Army Engineer Waterways Experiment Station, Department of the Army, Jan. 1994, (in Notice of References Cited for U.S. Appl. No. 13/332,992).

Blain, Cheryl Ann, et al, Software Design Description for the Advanced Circulation Model for Shelves, Coastal Seas, and Estuaries (ADCIRC), Naval Research Laboratory, Dec. 21, 2001, (in Notice of References Cited for U.S. Appl. No. 13/332,992).

Scheffner, et al, Real-Time predictions of surge propagation, Estuarine and Coastal Modeling, ASCE, 1997, (in Notice of References Cited for U.S. Appl. No. 13/332,992).

Magnusson, et al, Artefacts and remedies in direct Fourier tomographic reconstruction, Nuclear Science Symposium and Medical Imaging Conference, Conference Records of the 1992, IEEE, vol. 2, No. 25-31, pp. 1138-1140, 1992, (in Notice of References Cited for U.S. Appl. No. 13/332,992).

Averbuch, et al, 3D Fourier based discrete Radon transform, Applied and Computational Harmonic Analysis, vol. 15, Issue 1, pp. 33-69, Jul. 2003 (in Notice of References Cited for U.S. Appl. No. 13/332,992).

Notice of Allowance, U.S. Appl. No. 12/579,120, dated Jan. 17, 2013.

Lesue, Jacob Scott Lesue, Calibrating ADCIRC with tidal constituents using SMS as a preprocessor, Dept. of Civil and Environmental engineering, Aug. 2003, pp. 1-70.

U.S. Appl. No. 12/579,120, Non-Final Rejection, Mail date Nov. 28, 2011.

U.S. Appl. No. 12/579,120, Non-Final Rejection, Mail date Oct. 18, 2012.

U.S. Appl. No. 12/579,120, Final Rejection, Mail date May 11, 2012.

* cited by examiner

AUTOMATED MESH GENERATION AND EDITING TOOLS

CROSS-REFERENCE

This application claims the benefit of priority based on U.S. Provisional Patent Application No. 61/105,448 filed on Oct. 15, 2008, the entirety of which is hereby incorporated by reference into the present application.

TECHNICAL FIELD

The invention relates to the generation of unstructured grids for coastal ocean modeling.

BACKGROUND

The ADCIRC Coastal Circulation and Storm Surge Model is a system of computer programs that solve time dependent, free surface circulation and transport problems in two and three dimensions. The equations discretized within the ADCIRC model are often used to represent coastal ocean dynamics. Typical ADCIRC applications have included: (i) modeling tides and wind driven circulation, (ii) analysis of hurricane storm surge and flooding, (iii) dredging feasibility and material disposal studies, (iv) larval transport studies, (v) near shore marine operations.

The form of the discrete equations within the ADCIRC model utilizes the finite element method in space allowing the use of highly flexible, unstructured grids. The grids are typically comprised of linear triangles and are bounded by a closed, ordered set of coordinate points. The solution of the equations contained in the ADCIRC model is obtained for every nodal point or triangle vertex in the mesh.

Thus, it is desirable to have a simple method for creating an unstructured grid or mesh that accurately represents the boundaries and bathymetry of the area of interest.

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention provides tools for fully automated mesh generation that include automated robustness checks that may result in modifications of a constructed mesh, provides a means for editing and visualizing a mesh and its components, provides estimates of processing resources needed for implementation of the mesh as a part of a two-dimensional coastal ocean model application, and requires only two sources of data (an ordered coastline and bathymetry values). Meshes generated in accordance with the present invention can include properly formatted ADCIRC model grid files (fort.14 file) that can be used to represent coastal ocean dynamics in a discrete computational framework. The mesh generation and editing tools in accordance with the present invention can be implemented using MATLAB® and are platform-independent, usable in any number of different operating systems and configurations.

Using a simple graphical user interface, in accordance with the present invention, a user can load a boundary data file and a bathymetry file into an automated mesh generation tool and can make other selections governing the generation of a mesh, such as the type of coordinate system that reflects the form of the boundary information data, an initial type of element, e.g., an equilateral triangle, to be used in generating the mesh, an initial distance between nodes of the mesh elements, and an interpolation method to be used in assigning bathymetry data to the nodes. The user also can choose the number of mesh refinements to be made by the mesh generation tool based on the bathymetry data, wherein the initial triangles are divided into smaller triangles to reflect the different depth categories corresponding to the selected number of refinements. A mesh generation tool in accordance with the present invention can analyze the proposed mesh to determine the level of computing resources that would be required to implement a proposed mesh within a two-dimensional computational coastal ocean model so that a user can determine, before using those resources, whether to proceed with the generation of the mesh as is or whether some editing of the mesh parameters would be desirable.

Based on the input information, the mesh generation tool in accordance with the present invention can automatically generate a mesh that reflects the boundary and bathymetry data.

The present invention also provides a mesh editing tool and a related graphical user interface that can be used to further edit and refine a mesh, either a mesh created using the mesh generation tool of the present invention or a mesh of triangular elements created using any other suitable tool—The mesh editing tool in accordance with the present invention includes an automated master smoothing script that can automatically apply one or more "best practices" edits to the mesh, and further can include one or more editing tools that can be individually applied by a user using one or more graphical user interfaces to edit and refine the mesh as desired.

The mesh editing tool in accordance with the present invention also can include one or more mesh display options such as displaying the final edited mesh in conjunction with a background mesh or displaying the mesh with color-filled contours of the mesh bathymetry.

In addition, the mesh creation and editing tool in accordance with the present invention also can estimate the computing resources that would be needed to generate a mesh as designed by a user and can estimate a model time step for use with the grid in a computational model such as ADCIRC.

DETAILED DESCRIPTION

Figure 1:
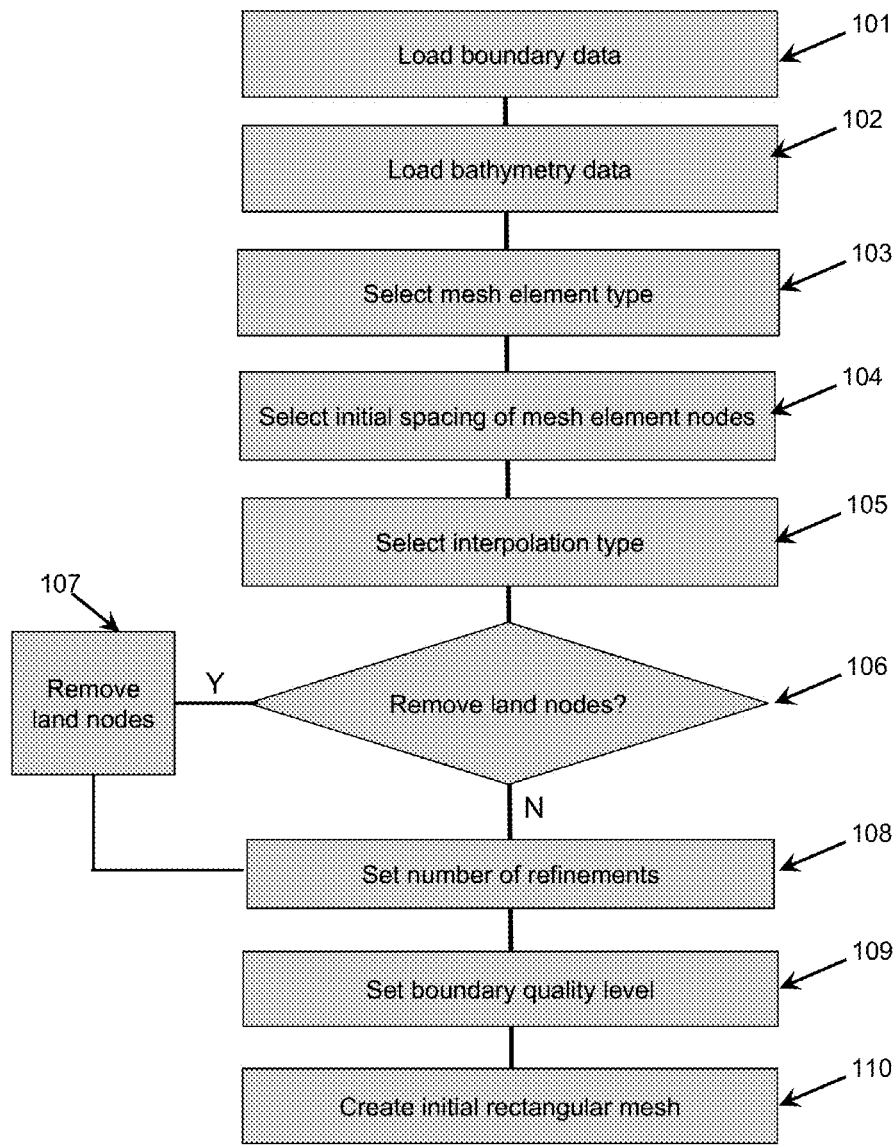
FIG. 1 depicts an exemplary flow of steps that can be taken in generating a mesh using a mesh generation tool in accordance with the present invention.

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

For example, in the description herein, one or more software components, tools, and/or programs may be referred to by specific names such as "meshcreate" and "meshedit," but it should be noted that such names are merely exemplary and that other appropriate names may be used. In addition, although grid modeling tools in accordance with the present invention may be described as being used with MATLAB® software for output to the ADCIRC coastal model, one skilled in the art would readily appreciate that the grid creation and editing tools in accordance with the present invention can be used with any appropriate software or for any appropriate application, with such modifications being well within the level of skill in the art. All such variations, modifications, and applications are also within the scope of the present disclosure.

The present invention provides a method for fully automated mesh generation that includes automated robustness checks and corrections of a constructed mesh, provides a means for editing and visualizing a mesh and its components, provides estimates of processing resources needed for generating a mesh and requires only two sources of data (an ordered coastline and bathymetry values). The present invention also provides mesh editing tools that can be used to automatically edit a mesh either by an automated script or by user selection of individual editing tools. In an exemplary embodiment described herein, the mesh generation and editing tools that can be used to create and/or edit a mesh can be accessed by a user via a graphical user interface (GUI), often referred to herein as MeshGUI, though it is possible that in other embodiments the tools can be accessed using programming line commands or otherwise.

As will be appreciated by one skilled in the art, a method for automated mesh creation and/or editing as described herein can be accomplished by executing one or more sequences of instructions contained in computer-readable program code read into a memory of one or more general or special-purpose computers configured to execute the instructions. The invention also includes a computer program product comprising a computer-usable medium having computer-readable program code embodied thereon, the computer-readable program code adapted to be executed to implement a method for automated mesh generation and/or editing comprising one or more aspects described herein.

In addition, one skilled in the art would readily appreciate that the form and content of the instructions that can be used to accomplish the steps described herein can take many forms, and all such instructions, irrespective of their form and/or content, are within the scope of the present disclosure.

The meshcreate program uses two external data files. Both of these files retain rather generic formats to enhance usability of the software and facilitate interfacing with unknown and varied data sources. The first data file is a boundary file that describes the geographic limits of the mesh to be created. Often the boundary file represents a coastline (the land/sea interface) and includes segments across open ocean waters in order to close the mesh boundary. The boundary file can however be constructed to include overland areas as long as supporting topographic information is available. The boundary file can be created using an auxiliary utility such as the MATLAB® utility makecoast, or can be derived from software such as the Surface Modeling System (SMS). The second required data file is a bathymetry file that contains water depths or land elevations that span the entire region enclosed by the boundary file. This bathymetry file provides the basis for the grid creation and refinement by meshcreate.

The meshedit program uses only one external data file, i.e., the ASCII text finite element grid file to be edited. This grid file must already exist, and can be the output of the companion meshcreate software or another mesh creation software package. The program meshedit also can accept a finite element grid file that is merely a background mesh of triangulated bathymetry. This type of file has the same format as the required input grid file, and is an optional output of the meshcreate package. It often is advantageous to modify a mesh, and then sub-sample bathymetry from the background mesh, interpolating it onto the modified mesh so as to retain fidelity of the original bathymetric data, and such operations are described below.

The meshcreate tool in accordance with the present invention follows these basic steps when generating a new mesh from bathymetry data and boundary information:

A rectangular mesh is created to encompass the domain defined by the boundary file with nodes spaced some initial distance apart; the initial distance is in meters, and is set by the user in the GUI.

Additional nodes are added to the grid based on the bathymetry data values; this process is called refinement, and the number of refinements is set by the user in the GUI.

Once the rectangular mesh is refined, the boundary information is used to "cut" the final mesh from the refined rectangular mesh.

The boundary quality is then checked, and duplicate nodes are removed. The final boundary will have a resolution that matches that of the refined mesh.

The meshedit tool follows these basic steps when the user desires to modify an existing mesh:

A mesh file specified by the user is loaded into the GUI and displayed in the GUI plot panel.

Modifications are selected and enacted by the user from the GUI. Generally, modifications are performed one-at-a-time over the entire mesh or for a user-delineated region of the mesh. A "best practices" script also can be selected which performs several mesh quality checks and subsequent modifications in sequence over the entire mesh.

The user then saves the modified mesh to a new file, either after one or more modifications or after all modifications is performed. It is recommended that the user save an updated version of the mesh at regular intervals to ensure that the final results are of the best possible quality and that intermediate steps can be retrieved if the results of an operation are unsatisfactory.

Most of the mesh GUI elements, or "widgets," described herein can include a related tool tip (also known as "bubble help"), such as a small, pop-up window containing a brief description of the widget that appears near the mouse pointer when the user places it on or near an item of interest. Such tool tips are well known in the art and will not be described further herein.

Figure 2:
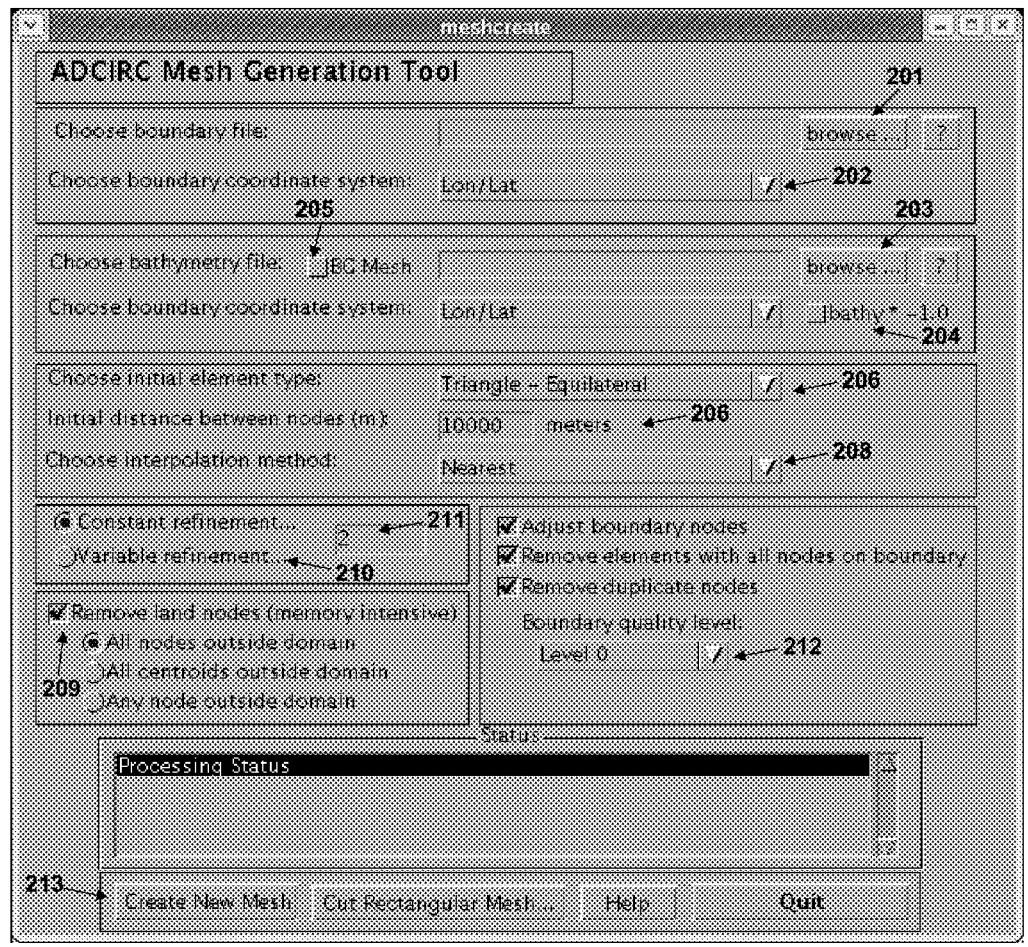
FIG. 2 depicts an exemplary graphical user interface for a mesh generation tool in accordance with the present invention.

As noted above, the meshcreate and meshedit tools in accordance with the present invention can be accessed and used by means of a graphical user interface such as the exemplary interface shown in FIG. 2. The user interface for meshcreate is aimed at simplifying application of the mesh generation tool. FIG. 1 depicts an exemplary process flow of steps that can be taken for the creation of a mesh in accordance with the present invention using the meshcreate GUI shown in FIG. 2 together with user-supplied bathymetry data and boundary information files.

At step 101, the user can choose a boundary information file by clicking on the first "browse" button 201 shown in FIG. 2. As part of this selection of boundary file information, the user can also select the coordinate system that reflects the form of the boundary information data, e.g. [longitude, latitude], [latitude, longitude], [X,Y], or [Y,X] by making an appropriate selection in drop down box 202.

At step 102, the user can select a desired bathymetry file to be loaded, either by entering the name directly or by clicking on browse button 203 and can choose the bathymetry file coordinate system in a similar manner as for the boundary information file. If necessary, the user can select the check box ("bathy*−1.0") 204 to reverse the sign of bathymetry values that are negative (the ADCIRC model expects positive depth values). The user also can select "BG Mesh" check box 205 if the bathymetry file is a previously created background mesh file from the meshcreate software. This option allows the user to omit the internal step of triangulating the bathymetry if one is using the same bathymetry data to create multiple grids (e.g., one may be creating several smaller grids within a larger geographic region).

At step 103, the user can choose the mesh element type by clicking on button 206 shown in FIG. 2. In many cases, the default value, "Triangle-Equilateral", may be the best choice, but other in other cases other geometries such as non-equilateral triangles may be used.

At step 104, the user can specify the desired initial spacing of the element nodes throughout the grid, for example by entering the desired value in box 207 in the GUI. This is the resolution that will remain at the deepest locations in the domain and is in effect the maximum resolution of the created grid. As described below, specifying the initial resolution and the number of refinements can dictate the total number of nodes in the final mesh and the finest resolution achieved in the mesh generation process. If only a specified number of refinements is selected, the depth range of the entire mesh is divided by that number of refinements to identify the depths at which successive refinements will occur. Conversely, the user could specify the actual depths at which successive refinements are desired. Refinement proceeds from the deepest depth to the shallowest such that the smallest size triangles are created in the shallowest water.

At step 105, the user can then choose the type of interpolation desired for assigning bathymetry data to the grid nodes by selecting from drop-down box 208. In most cases, the default method of nearest neighbors is sufficient, but other options may be defined.

At step 106, the user can choose whether or not to remove land nodes outside the grid boundary in the process of creating and refining the grid by checking or unchecking "Remove land nodes" box 209 in the GUI. Removing land nodes outside the grid boundary is generally done to ensure that nodes and elements do not extend beyond the domain defined by the original boundary information file. Note that this operation is very memory intensive, and in some circumstances it may be desirable not to perform this step if the user wishes to retain the refined rectangular grid encompassing the domain defined by the boundary information file. Thus, if the answer at step 106 is "yes, i.e., "remove land nodes" box 209 is checked, at step 107 the land nodes outside the grid can be removed, while if the answer at step 106 is no, the user can then proceed directly to step 108. In addition, in some embodiments such as is shown in FIG. 2, the GUI can display a warning message that removing land nodes is memory intensive so that the user can make an appropriate choice.

At step 108, the user can select the number of refinements and whether the number of refinements is to be constant or variable by selecting the appropriate radio button 210. If the user selects a constant number of refinements, the desired number can be entered into box 211 shown in FIG. 2, in which case the depths at those refinements will be automatically determined and evenly distributed over the range of depths in the mesh. Alternatively, the "variable refinement" radio button may be selected, and in that case specific depths may be named at which refinement will occur, with those depths being entered in box 211. A typical value of 4 or 5 levels of refinement may become resource-intensive on larger domains. As noted above, specification of the initial resolution and the number of refinements can dictate the total number of nodes in the final mesh and the finest resolution achieved in the mesh generation process.

At step 109, the user can select the level at which the boundary quality is checked. For example, no changes are made to nodes and elements that lie along the grid boundary under Level 0, while under Boundary Quality Level 1, the element quality must be greater than 0.6. The element quality, q, is defined by the relation:

$$q = \frac{A * 4\sqrt{3}}{L1^2 + L2^2 + L3^2}$$

where A is the area and L1, L2, and L3 are the side lengths. Nodes are moved and elements reformed to achieve the desired element quality. Under Boundary Quality Level 2, a similar element quality threshold of 0.6 is desired. Triangle nodes are moved and/or removed and elements recombined and this process is iterated as opposed to Boundary Quality Level 1 where the process is performed once. As part of this step, as shown in FIG. 2, the user also can select whether to make other boundary quality adjustments, such as "adjust boundary nodes," "remove elements with all nodes on boundary," or "remove duplicate nodes."

Finally, at step 110, the user can press the "Create New Mesh" button 212 to begin mesh generation using the supplied boundary information file, the supplied bathymetry data, and the selected parameter specifications. The user then can be prompted to enter in a name (including extension ".grd") and directory location of the new mesh to be created. Once the user selects "save", the mesh will be generated.

In accordance with the present invention, the meshcreate tool saves the generation process as a series of grids reflecting the different step of the mesh generation process. The saved grids include:
  <grid name>.save1.grd—The refined grid prior to the removal of nodes and elements outside of the supplied boundary information file.
  <grid name>.save2.grd—The initial grid prior to refinement, uncut by the boundary data, with the coarsest nodal spacing as specified by the user.
  <grid name>.grd—The final grid, with the final extension being entered by the user in step 110. This grid can be refined using one or more of the meshedit tools described herein or with a third-party mesh editing tool such as the open source tool xmgredit, with the bathymetry being re-interpolated using the provided MATLAB® utility bath2grd or by any other appropriate means.
  <user_supplied_name>.grd—The user can choose to save the triangulated bathymetry data as a grid file that could be imported later as a "background mesh" or "BG Mesh".

After the bathymetry data are triangulated during the mesh generation step 110, as described below, the user also can be prompted for whether to save the new bathymetry mesh as a background mesh for later use. If the user chooses to save the mesh, a file selection dialog box can appear on the screen in which the user can enter a new file name or select an existing file. The background mesh data are then written to the file, and a status message listing the output file can be printed in the status window. If the user chooses not to save the mesh, only a status message is issued. Program execution continues once the user interaction is complete.

As noted above, the grid can be refined to provide greater resolution that more closely reflects the bathymetry of the area of interest. In some cases, the refinement by depth criteria employed by meshcreate described above has limitations in adequately capturing the geometry of deep, narrow channels. In those cases, one or more meshedit tools described below can be used during the mesh creation process to refine the mesh. One refinement technique that can be used is the Split-4 refinement process described below, which splits an individual element into four new elements, though other refinement techniques can be used. Once refinement process is complete, the refined mesh (typically a rectangular grid encompassing the original boundary data) can be imported into meshcreate and a final mesh obtained from the refined mesh.

Experience has shown that grids that have been refined and remain uncut by the boundary data (i.e., retain their initial rectangular bounding box) are prone to require computational resources that may exceed local capacity. If this approach proves to be too computationally intensive for the available computer resources, the final grid (i.e., the non-rectangular, "cut" grid) can be modified and the bathymetry can be re-interpolated such a utility such as the MATLAB® bath2grd utility described below.

The bath2grd utility is interpolates bathymetric or topographic data onto an existing grid of triangular elements using bilinear interpolation algorithms. It requires an existing grid and a bathymetry data file that has the same format as used for meshcreate.

Bath2grd can also perform a coordinate transformation, converting from spherical (degrees latitude/longitude) to Cartesian (meters X/Y) coordinates for more accurate interpolation. Such a conversion is triggered by a toggle flag specification. For the case of a conversion from longitude and latitude to Cartesian, the CPP, Carte Parallelo-grammatique projection known in the art, can be used; in such a case, a central reference location (rlon, rlat) for the projection must be specified. The values of rlat and rlon can be obtained from the existing grid file (oldfile) using the interactive MATLAB® program, delt_interact, or by using any other appropriate method. If delt_interact is used, it program should be executed prior to executing bath2grd, unless the user already has known values for rlat and rlon.

Because, as noted above, some meshes such as an uncut refined mesh may require excessive computer resources, in some cases, it may be desirable to evaluate the computational requirements of a mesh, either before generating a final mesh or after. Consequently, a method for mesh creation and editing in accordance with the present invention can include such an evaluation, for example, in the form of a MATLAB® utility referred to herein as nnodes_vs_time. The nnodes_vs_time utility uses estimates for the number of nodes in the grid, the time step size, the simulation length, and the total wall clock time allowable for operational execution, and returns an estimate of the necessary number of CPUs required to complete the simulation as specified by the user-input parameters, the number of nodes per processor which is a reflection of the communication overhead (too few nodes/processor will result in large communication costs) and a graph of the CPU time in hours vs. the number of CPUs.

If the number of nodes per processor falls below 1000, the nnodes_vs_time utility can issue a warning to advise the user that the number of processors required would adversely affect the mesh processing due to the small number of nodes per processor, and can provide a recommendation of the number of processors that would improve the computational overhead needed.

The computational time estimates computed within the nnodes_vs_time utility are empirically derived by curve fitting actual ADCIRC model simulation times for a particular computer platform knowing that ADCIRC model scaling is nearly linear on most machines. Obviously, as computer processor units become faster and communication speeds improve, the empirical relationship assumed may become outdated.

As noted above, in some embodiments, the present invention can automatically generate a properly formatted fort.14 grid file that can be used as an input to the ADCIRC coastal modeling system. In such embodiments, the final step in generating such a properly formatted fort.14 file in accordance with the present invention is the extraction of boundary nodes and the assignment of boundary types to these nodes. This information is appended to the nodal coordinate and element incidence list in the grid file created by MeshGUI in accordance with the present invention. The Fortran utility, bnd_extr.f located in the ADCIRC_Utilities/Boundary_Processing/Physical/directory of the Fortran repository, incorporated herein by reference, or any other appropriate utility can be used to accomplish this task. The operation of the bnd_extr.f utility is not essential to the present invention and will not be described in detail herein.

Figure 3:
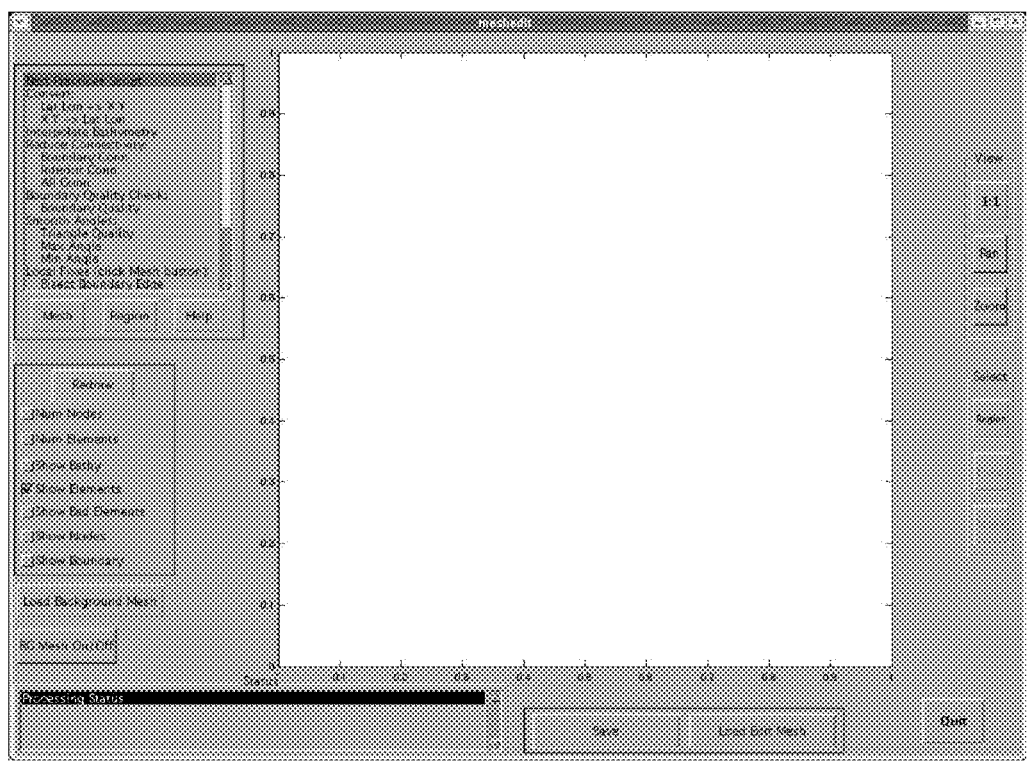
FIG. 3 depicts an exemplary meshedit graphical user interface for a mesh editing tool in accordance with the present invention.

As noted above, the present invention also provides a mesh editing tool that can be accessed by a user via a meshedit GUI such as that shown in FIG. 3.

Figure 5:
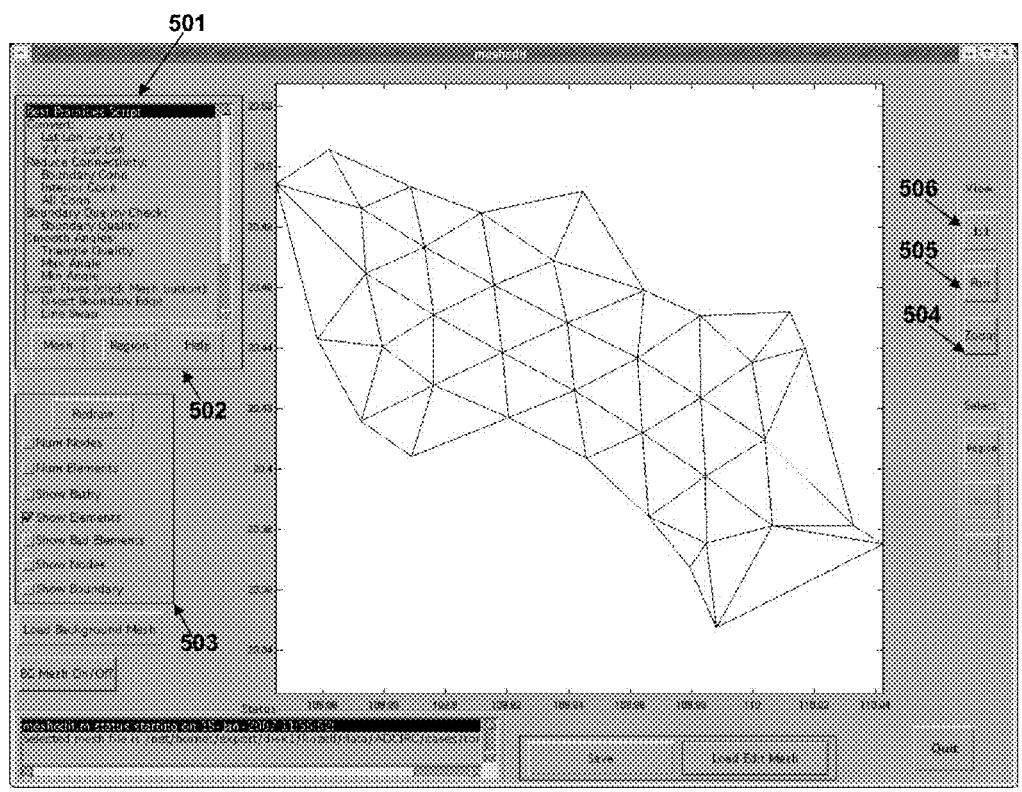
FIG. 5 depicts an exemplary mesh displayed in a meshedit graphical user interface for a mesh editing tool in accordance with the present invention.

Once the mesh creation, refinement, interpolation, evaluation, and boundary processes described above have been completed, the created mesh can then be either saved as described above for later use or can be displayed and edited in a meshedit GUI as shown in FIG. 5. If the user does not choose to open meshedit, meshcreate can wait for further user input, such as opting to exit the program, to create another new mesh, or to open an existing (rectangular) mesh for which boundary cutting operations is desired.

Figure 4:
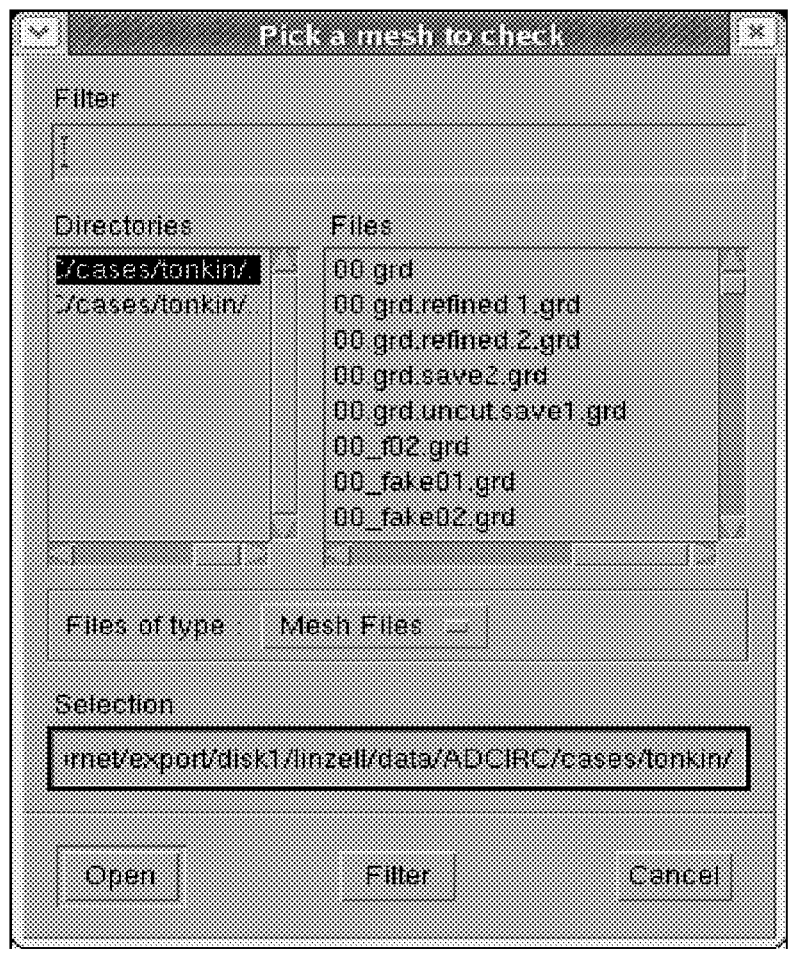
FIG. 4 depicts an exemplary file selection box that can be used for loading a mesh for editing in accordance with the present invention.

If the user does choose to open the newly created mesh in the meshedit GUI, for example by selecting a "Yes" button on a screen prompt, the meshcreate GUI is closed, and as shown in FIG. 5, the meshedit GUI can be opened with the newly created mesh displayed. The meshedit GUI provides the user with a simple intuitive interface in which to edit a mesh, either a mesh that was just generated using meshcreate or a saved mesh that is loaded into the meshedit GUI using any appropriate file selection interface such as the interface shown in FIG. 4.

As shown in FIG. 5, the mesh to be edited, hereinafter referred to as the "edit mesh," can be presented in the plot area with only the mesh elements displayed. The user can then add other mesh attributes to the plot or proceed with the editing process. Details of the available mesh editing operations and the mesh display attributes will now be described in the order of their appearance within the GUI.

Figure 6A:
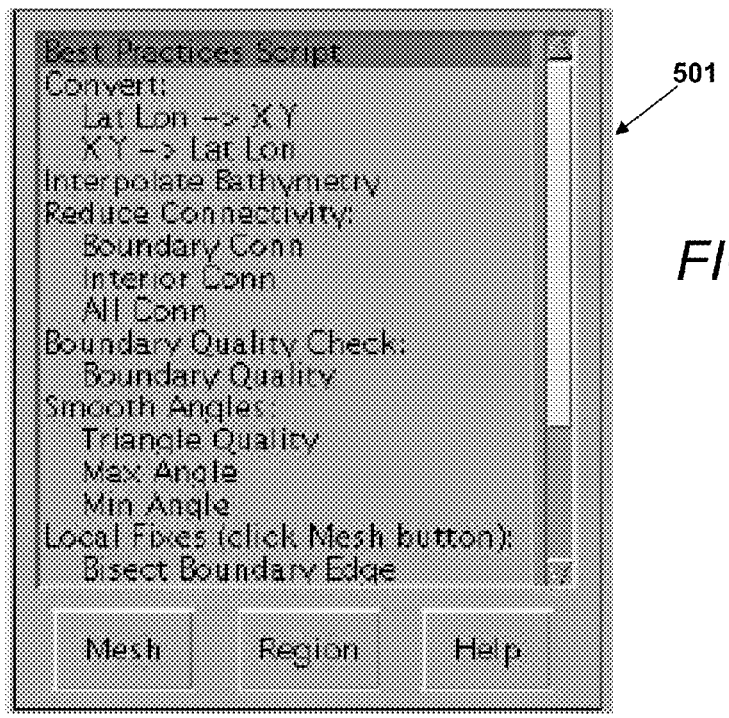
FIGS. 6A and 6B depict enlargements of an exemplary selection box in the meshedit graphical user interface that can be used to select one or more mesh edit operations in a mesh editing tool in accordance with the present invention.

As described below, editing can be done by executing a Best Practices Script as described below or by executing one or more individual editing routines. In the exemplary meshedit GUI shown in FIG. 5, the available mesh operations are located in the upper left scrolling panel 501 in the FIG. 5 and as shown in greater detail in FIGS. 6A and 6B. In accordance with the present invention, the user can select any one of these operations by clicking on the corresponding operation name shown in scrolling panel 501 or by any other appropriate means. In many cases, when an editing function is activated, one or more additional windows can open to allow the user to provide the information required for that editing function.

Best Practices Script

Selection of this option executes a master_smoothing_script that can apply several mesh adjustment and smoothing routines in order to improve overall mesh quality. The script is a "best practices" approach to applying available mesh quality improvements.

To appropriately apply these mesh manipulations, the mesh must be in Cartesian (X/Y) coordinates instead of spherical (latitude/longitude) coordinates. If the user selects this option, the program issues a prompt for whether to apply a coordinate transformation, as shown in FIG. 7A and as described below with respect to the convert mesh operation.

Figure 7A:
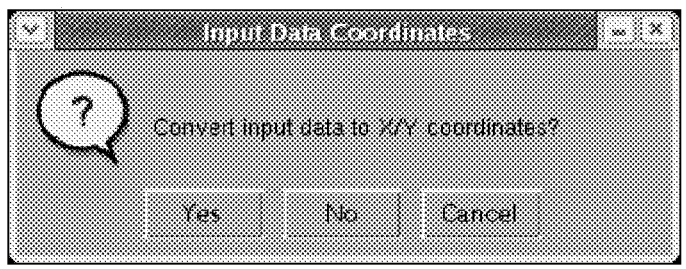
FIGS. 7A-7D depict aspects of a screen displays associated with a Best Practices Script mesh operation in accordance with the present invention.

If the user chooses not to convert by clicking the No or Cancel buttons shown in FIG. 7A, the script continues without converting the coordinates. This should be done only if the edit mesh currently loaded is already in X/Y Cartesian coordinates. If the user clicks the Yes button shown in FIG. 7A to convert the mesh coordinates, a prompt such as that shown in FIG. 7B can displayed to allow the user to enter the coordinates of the centroid of the CPP transformation.

Figure 7B:
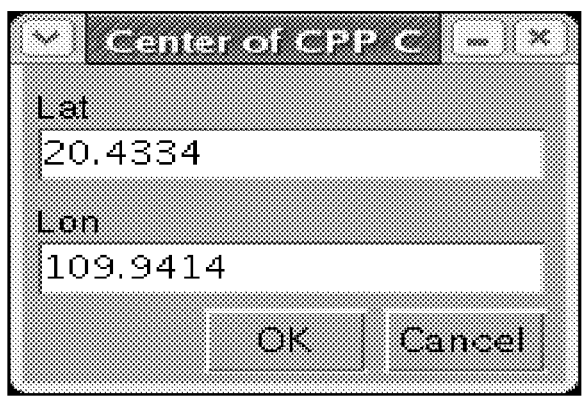

As shown in FIG. 7B, the mean latitude and longitude of the mesh can be displayed in the prompt, and the user can modify either or both of these values before clicking the OK button. If the Cancel button is clicked, the master_smoothing_script continues, but will not convert the coordinates to and X/Y frame, and so as noted above, this option should be chosen only if the mesh already is in X/Y coordinates.

Figure 7C:
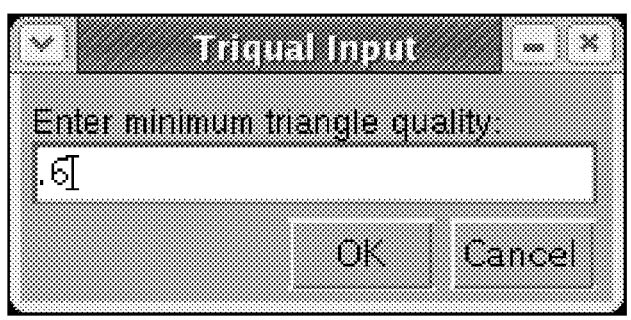

After the coordinate conversion prompts are issued, the user can be prompted to enter a minimum value for the triangle quality ("triqual") parameter by a prompt such as that shown in FIG. 7C that is displayed on the screen. As shown in FIG. 7C, the default triangle quality value is 0.6, and has been selected as a balance between an ideal goal of equilateral triangles (i.e., triqual=1.0) and establishing a maximum internal angle threshold of less than 120° for an element, and in most cases will be the value that would be selected, though other values may be specified by a user. Higher values of the triqual parameter are more restrictive on the allowable element shape and entail significantly greater computational effort. Triangle quality measures less than 0.6 could result in ill-formed elements that affect stability of the model over the mesh and, ultimately, could degrade the computed solution for that mesh.

Figure 7D:
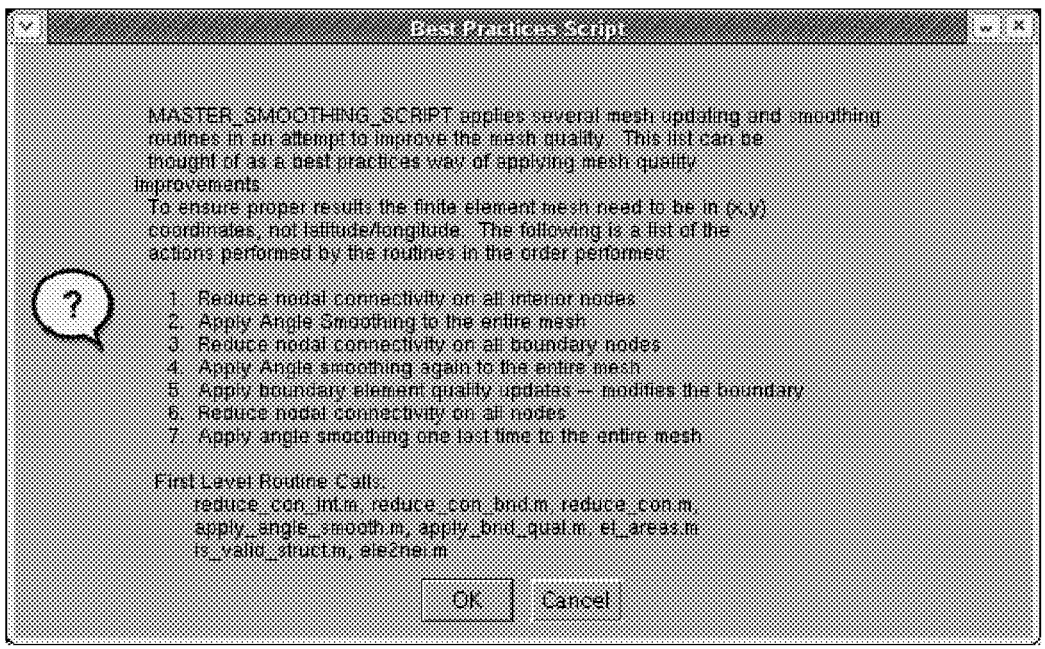
Figure 18:
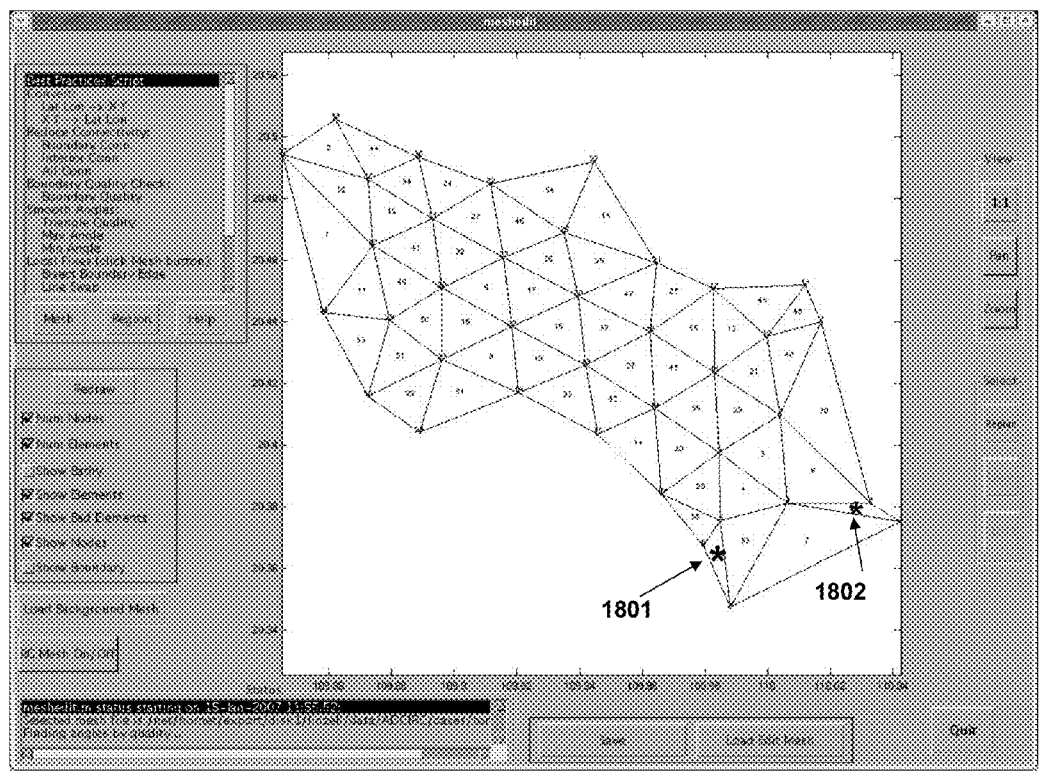
FIG. 18 depicts an exemplary mesh display using the Show Bad Elements mesh display option in accordance with the present invention.

Following specification of a triangle quality parameter, the meshedit GUI displays a window such as that shown in FIG. 7D which contains descriptive text that summarizes the "Best Practices" procedures. The "Master Smoothing" procedure in FIG. 18 includes the following steps:

Reduce nodal connectivity on all interior nodes
    Apply angle smoothing to the entire mesh
    Reduce nodal connectivity on all boundary nodes
    Apply angle smoothing again to the entire mesh
    Apply boundary element quality updates, which modifies the boundary
    Reduce nodal connectivity on all nodes
    Apply angle smoothing one last time to the entire mesh The MATLAB® functions employed by the script are also listed. The user must select the OK button to continue execution of the script. Execution of the script can be canceled by selecting the Cancel button. During script execution, status messages are printed to the MATLAB® command window and in the status window of the meshedit GUI. A brief summary of any mesh changes are printed at the end of the script run. After the script has completed execution, the user can save the modified mesh, then exit the program or continue processing the mesh.

Convert

This subset of mesh operations converts mesh nodes and elements from one coordinate system to another. The Lat/Lon→X/Y option converts from latitude/longitude coordinates to Cartesian X/Y coordinates. The X/Y→Lat/Lon option converts from Cartesian X/Y coordinates to latitude/longitude coordinates. As noted for the Best Practices Script option, all mesh editing operations must be performed in Cartesian coordinates. The user must ensure that the conversion is performed, if necessary, prior to further mesh operations.

Interpolate Bathymetry

Interpolate Bathymetry allows the interpolation of bathymetry data onto a new mesh. The user can input either an existing background mesh or a simple ASCII text "XYZ" format (i.e., three columns containing, respectively, longitude, latitude, and depth) file to provide bathymetry values for interpolation onto the edit mesh. A background mesh that can be used in this function can be in the form of an ASCII text mesh file containing triangulated XYZ bathymetry data. The triangulation process creates a set of triangle vertices optimally formed from the coordinates of the bathymetric data. Typically a "background mesh" is created from a bathymetric data set while an "edit mesh" is formed using other element formation criteria such as employed in meshcreate or equivalent software.

Figure 8A:
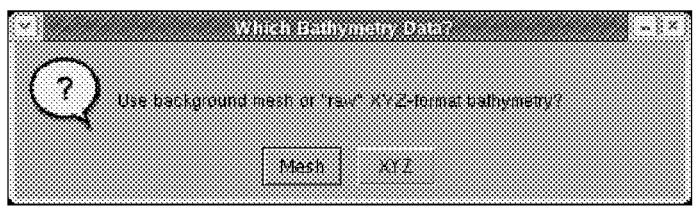
FIGS. 8A-8D depict exemplary screen prompts that can be used in connection with an Interpolate Bathymetry mesh editing tool in accordance with the present invention.

If the user selects this operation and then clicks the Mesh button in Mesh Operations panel 502 in the meshedit GUI, a prompt such as the exemplary prompt shown in FIG. 8A can appear requesting the type of bathymetric data to use, "mesh" bathymetric data or "XYZ" bathymetric data.

If the user selects the Mesh button shown in FIG. 8A, the program can check whether a background mesh already has been loaded. If so, then the user can be prompted as shown in FIG. 8B for whether to use that background mesh or a new one.

Figure 8B:

If the user selects the Current button as shown in FIG. 8B, the currently loaded background mesh is used as the bathymetry data source for interpolation. If the user selects the New button shown in FIG. 8B, a file selection dialog box can be opened for the user to select a different background mesh file. The selected background mesh then served at the bathymetry data source for the interpolation.

Figure 8C:
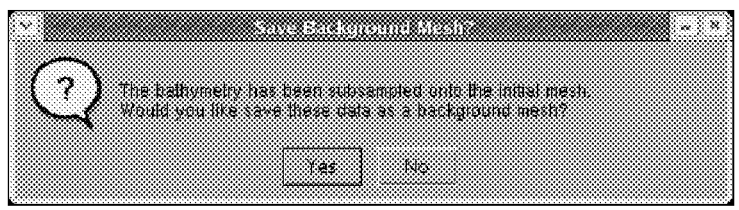
Figure 8D:
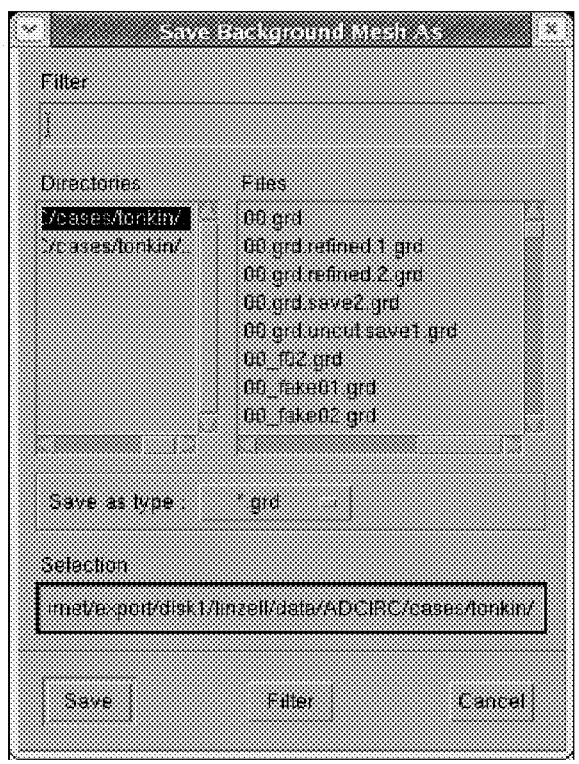

Alternatively, if the user selects the XYZ button shown in FIG. 8A, a file selection dialog box is opened for the user to select a bathymetry data file. The user-specified file is loaded and the bathymetry is triangulated in a similar manner as described above with respect to the creation of a background grid. The user is then prompted for whether to save this newly triangulated bathymetry as a background mesh for later use, as shown in FIG. 8C. If the user selects the Yes button in FIG. 8C, a file save dialog box such as the dialog box shown in FIG. 8D can appear for the user to specify a new file name for the output mesh or use an existing file name to overwrite an existing file, and the background mesh is saved. The user can also choose not to save the background mesh, either by selecting the user can select either the No button in the Save Background Mesh prompt shown in FIG. 8C or the Cancel button in the file save dialog box shown in FIG. 8D, and in such a case the bathymetric the data will not be saved as a background mesh. Once the user interaction is complete, the newly triangulated bathymetric data are interpolated onto the edit mesh.

Reduce Connectivity

This operation reduces the connectivity of the elements through a single node so that each node is connected to fewer than 7 neighboring elements. Nodal connectivities of twenty or more elements are handled by the software. Perfectly equilateral triangles result in six elements connected to a given node. Three options are available for application of this reduce connectivity feature:

Boundary Connectivity—reduces the connectivity of boundary nodes

Interior Connectivity—reduces the connectivity of interior nodes

All Connectivity—reduces the connectivity of all nodes, boundary and interior

The boundary connectivity examines only those elements connected to the boundary. The Interior Connectivity option works on elements interior to the domain, elements with no nodes coincident with the boundary. Lastly the All Connectivity option aims to reduce the connectivity on all elements, those connected to the boundary and those on the interior of the domain.

Boundary Quality Check

The Boundary Quality Check mesh operation enforces the triangle quality value selected by the user as described above with respect to FIG. 4D to all boundary elements. In addition, in some embodiments, the Boundary Quality Check mesh operation can apply other enhancements to the boundary elements, such as enforcing element quality and reducing element connectivity for elements adjacent to the boundary.

Smooth Angles

A subset of angle smoothing operations implements mesh smoothing using an angle-based approach. Three options are available:

Triangle Quality—enforces an element quality having a value of 0.6 or higher, as described above with respect to FIG. 4D;

Maximum Angle—ensures that element angles are no greater than a user-supplied maximum Minimum Angle—ensures that element angles are no less than user-supplied minimum.

Figure 9A:
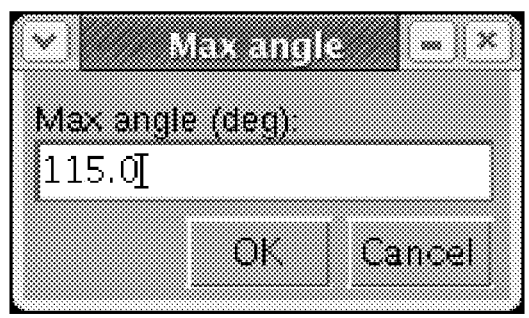
FIGS. 9A and 9B depict exemplary screen prompts that can be used in connection with a Smooth Angles mesh editing tool in accordance with the present invention.

If the user selects the Triangle Quality option, a "triqual input" prompt similar to that shown in FIG. 7C can appear. In most cases, the default minimum value of 0.6 or a larger value should be used as the triangle quality value. For the Maximum Angle option, the user is prompted to enter a maximum angle value to replace the default of 115.0°, as shown in FIG. 9A, or select the OK button without changing the value to use the default. In many cases, the default value will be the optimum value, but other values may be selected. Once the desired maximum angle is entered, the software searches all of the mesh elements to determine the angles of each triangle, flags any angles that exceed the maximum, and attempts to modify any element having a flagged angle.

If the user selects the Minimum Angle option, the program prompts the user to enter a minimum angle value, as shown in FIG. 9D. As for the Maximum Angle option, the user can enter a value to replace the default of 25.0°, or select the OK button without changing the value to use the default. As with the Maximum Angle, in many cases, the default minimum angle value will be the optimum value, but other values may be selected. Once the desired minimum angle is entered, the software searches all of the mesh elements to determine the angles of each triangle, flags any angles that are less than the minimum, and attempts to modify any element having a flagged angle.

The previously described mesh operations are applied to the mesh as a whole. The mesh operations described below are implemented element by element, one element at a time, and are thus labeled Local Fixes in box 501 shown in FIG. 5 and FIGS. 6A and 6B. By using one or more of these Local Fixes, a user can further refine and customize the mesh to meet the user's needs.

Bisect Boundary Edge

Figure 10:
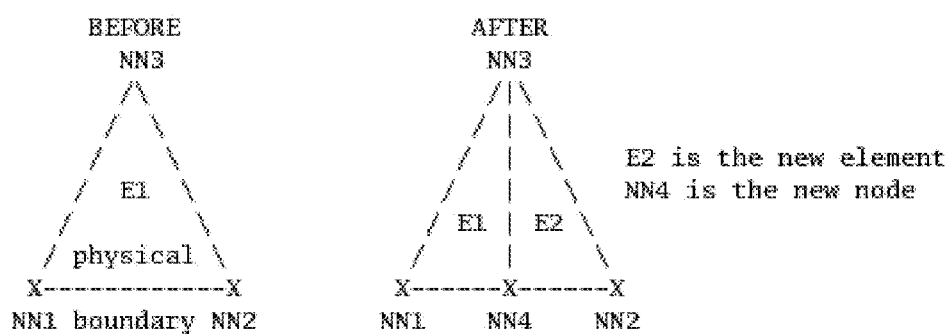
FIG. 10 illustrates aspects of a Bisect Boundary Edge mesh editing tool in accordance with the present invention.

The Bisect Boundary Edge mesh operation shown in FIG. 10 can be performed on individual user-selected boundary elements to reduce the size of large elements or to add single elements where sparse coverage occurs. The result is an increase in resolution along the boundary by forming two elements where one existed through the bisection of one edge of the original element. Once Bisect Boundary Edge is selected, a set of crosshairs can appear in the plot region of the GUI, and the user can be instructed (for example, by a message in a MATLAB® status window or by a popup window) to select a desired boundary element E1 using a pointing device such as a mouse. Once the desired boundary element E1 is selected, as shown in FIG. 10, the meshedit software can bisect the selected element's edge that lays on the physical boundary between node numbers NN1 and NN2. The result is the addition of a new node (NN4) and a new element (E2) to the finite element structure. In MATLAB® embodiments, the area and boundary fields in the fem_struct MATLAB® structure can also are updated, and if a nodal neighbor table is present within the MATLAB® workspace, it can be updated as well.

Line Swap

Figure 11A:
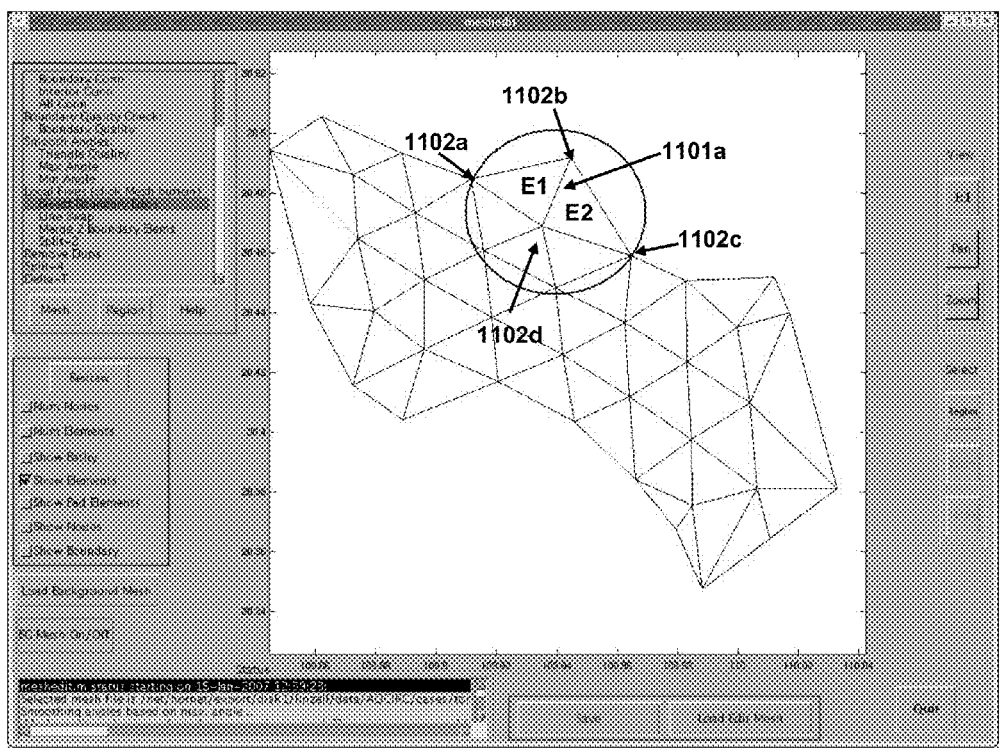
FIGS. 11A and 11B illustrate an exemplary application of a Line Swap mesh editing tool in accordance with the present invention.
Figure 11B:
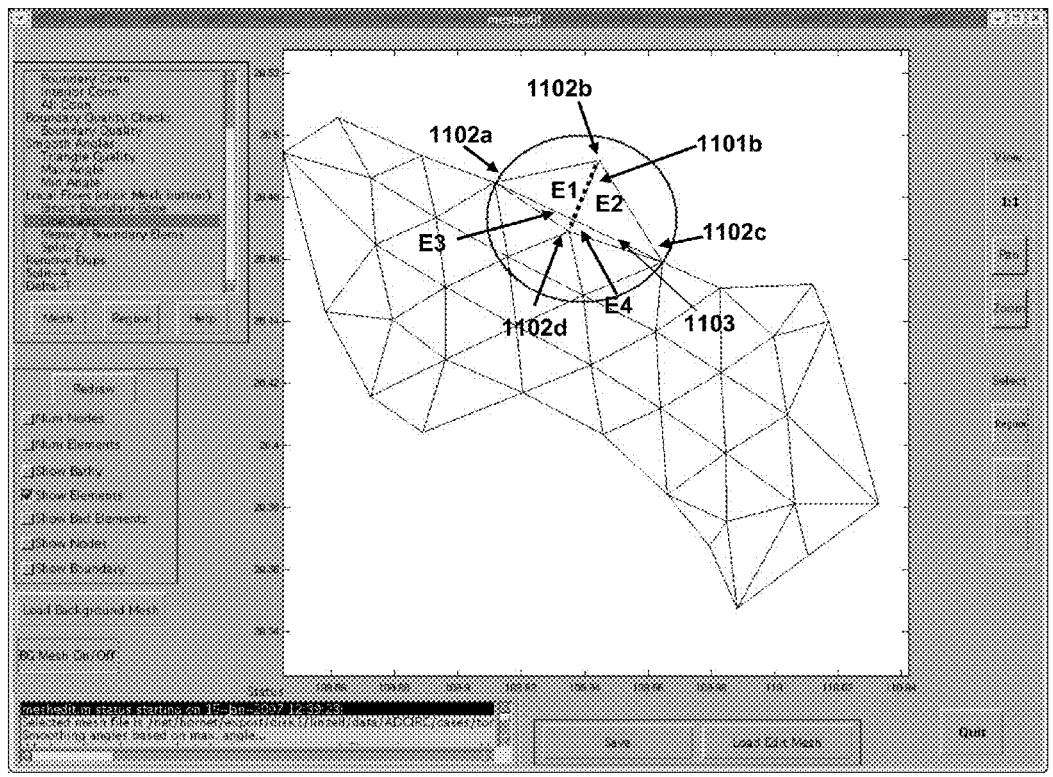

The Line Swap option shown in FIGS. 11A and 11B is a mesh refinement tool that swaps the nodal connectivity of an edge shared by two elements E1 and E2. In this operation, a shared edge 1101a between two elements E1 and E2 is disconnected and reconnected via the two remaining nodes of the four nodes 1102a-1102d associated with the two elements. The edge is thus "swapped" and replaced with another edge. This routine operates on one element edge at a time and can be used only if the two elements share an edge.

As with the Bisect Boundary Edge option, selecting the Line Swap option activates a pair of crosshairs with which the user selects the two adjacent elements E1 and E2 sharing a common edge 1101a that is to be swapped. When the user selects elements E1 and E2 with the crosshairs, a visual display of their shared edge 1101 can be modified, for example by changing the color or changing the edge to a dotted line. As seen in FIG. 11B, the original shared edge 1101a is now displayed as a dotted line 1101b, while the new edge 1103, perpendicular to the original edge, is displayed as a solid line. However, it should be noted that this operation can result in one or more severely skewed element such as elements E3 and E4 shown in FIG. 11B, an undesirable quality in any mesh, so care should be taken in using this option.

Merge 2 Boundary Elements

Figure 12:
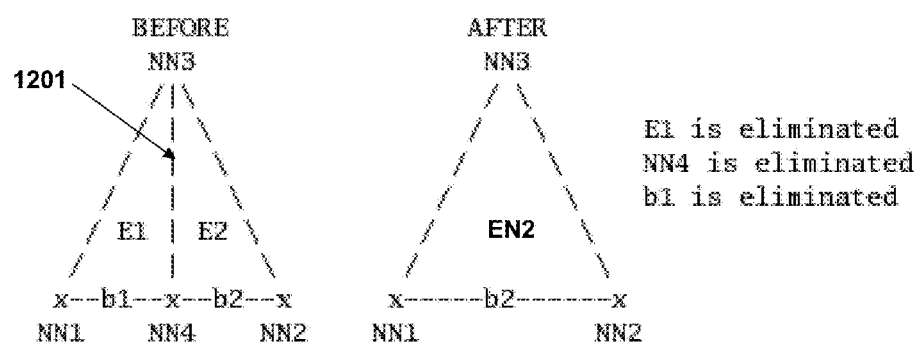
FIG. 12 illustrates aspects of a Merge 2 Boundary Elements mesh editing tool in accordance with the present invention.

This option, illustrated in FIG. 12, merges two adjacent boundary elements E1/E2 that have a common edge and adjacent edges along boundary into a single element EN2. The result is the elimination of one element from the grid and from the finite element structure as well as the removal of one boundary segment. This option could be chosen if, for example, a very narrow boundary element was adjacent to a much wider element. The two could be merged to remove the narrow, skewed element.

Similar to the Line Swap, in this operation, the user can select two adjacent elements using crosshairs displayed in the meshedit GUI. Thus, in the exemplary application of this operation shown in FIG. 12, elements E1 and E2 shared boundary 1102 and nodes NN1, NN2, and NN4 along boundary edges b1, b2 are selected. By applying the Merge 2 Boundary Elements operation, element E1, boundary segments 1201 and b2, and node NN4 are eliminated, and merged element EN2 having boundary edge b2 and nodes NN1 and NN2 results.

In some embodiments, as part of this operation element areas can be updated within the fem_struct MATLAB® structure and, if present, the nodal neighbor list (*.nei) can also be updated.

Split-2

Figure 13A:
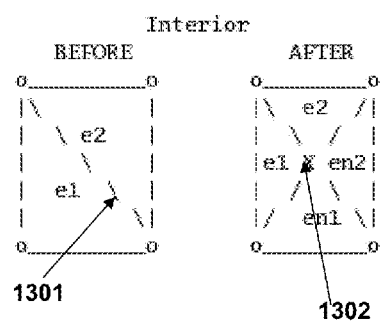
FIGS. 13A and 13B illustrate aspects of a Split-2 mesh editing tool in accordance with the present invention.
Figure 13B:
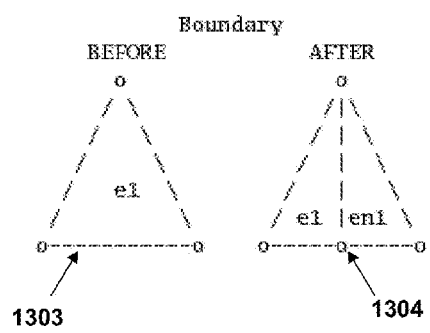

The Split-2 operation illustrated in FIGS. 13A and 13B is a mesh refinement option that splits into four elements the region spanned by two adjacent elements. The Split-2 proceeds by placing a new node at the midpoint of the shared element edge, then rejoining all of the original nodes to the new node. If the adjacent elements are boundary elements then the new node is placed on the boundary and the element is split using the new boundary node.

As described for the Line Swap, for this operation the user can select two adjacent elements using crosshairs shown in the meshedit GUI. FIG. 13A illustrates an exemplary application of the Split-2 editing operation on two interior mesh elements e1 and e2, while FIG. 13B illustrates an application of Split-2 on a boundary element e1. As shown in FIG. 13A, the two interior elements e1 and e2 divided by boundary line 1301 are each split into two elements e1/en1 and e2/en2 by the placement of a new node 1302 at the midpoint of line 1301. In FIG. 13B, a single boundary element e1 having a boundary line 1303 is split into two elements e1/en1 by the placement of a new node 1304 at the midpoint of line 1303. As shown in the figures, the Split-2 operation for interior elements creates a total of four elements in place in place of the two original ones. For a boundary element, the Split-2 operation forms two elements in place of the original boundary element. Only one new node is added in each scenario and the MATLAB® FEM structure is updated accordingly.

Remove Duplicates

This option is used to remove duplicate elements and nodes from the finite element method (FEM) structure. Duplicate elements (nodes) have triangle vertices (nodes) whose coordinates are nearly the same, within a specified threshold, as the verticies (nodes) of another element. These elements (nodes) can be an artifact of the quality checks or mesh generation process and are removed from the mesh. The Remove Duplicates operates on the entire mesh.

Split-4

Figures 14A, 14B, 14C:
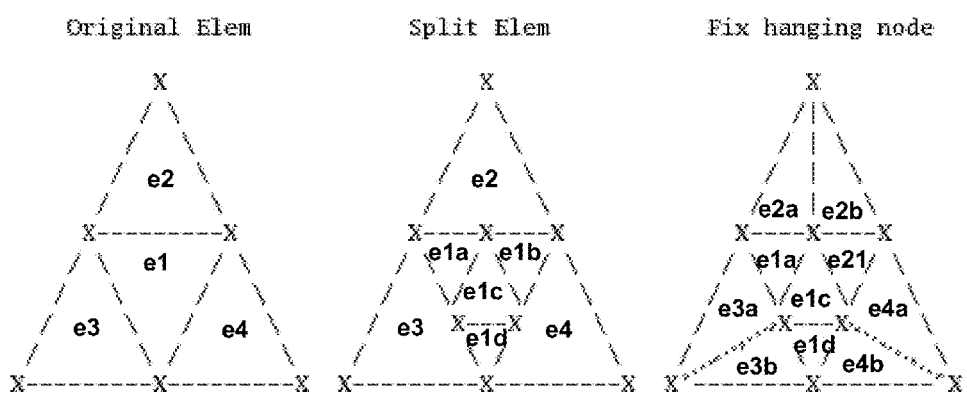
FIGS. 14A-14C illustrate aspects of a Split-4 mesh editing tool in accordance with the present invention.

The Split-4 operation illustrated in FIGS. 14A-C is a mesh refinement option that splits an individual element into four new elements. The first step splits an element into four elements. This is accomplished by first inserting new nodes at the midpoints of the three edges of the element; and connecting these mid-edge nodes to create a central element. The remaining three elements are formed by connecting the edges of the central element with the vertices of the original triangular element. The final step corrects for "hanging" nodes, nodes that occur at the mid-point of an element edge. The hanging nodes are connected to element vertices that bisect their adjacent element. The Split-4 operation for a single element ultimately results in an increase from four to ten elements over the same area. The Split-4 operation can be selected for the entire mesh or for a user-specified region of the mesh.

FIGS. 14A-14C illustrate the successive steps of the Split-4 procedure on a hypothetical element e1 surrounded by three neighboring elements e2, e3, and 34. FIG. 14A illustrates the original elements e1, e2, e3, and e4. As shown in FIG. 14B, element e1 is refined by the Split-4 operation such that four new elements e1a, e1b, e1c, and e1d are created. As shown in FIG. 14C, each of the resulting "hanging" nodes e2, e3, and e4 are rectified by bisecting adjacent elements to form six new elements e2a/e2b, e3a/e3b, and e4a/e4b. FIG. 14C shows the final element configuration resulting from this operation.

Figure 15:
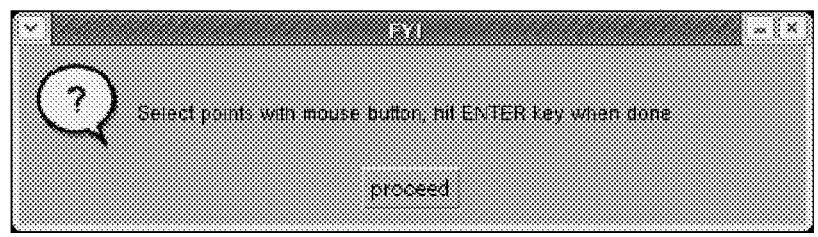
FIG. 15 illustrates an exemplary screen prompt that can be used in connection with a user selection of a subset of a mesh for editing in accordance with the present invention.

The Split-4 operation does not need to be applied to individual elements or neighboring elements but instead can be applied to a larger, user-specified region of the mesh. The user can initiate application of this or other appropriate operations to a particular region of the mesh by clicking on the "Region" button in Mesh Operations panel 502 in the meshedit GUI. When the "Region" button is selected, a prompt such as that shown in FIG. 15 can be displayed in the GUI, prompting the user to elect points that define a polygonal region for application of the Split-4 operation.

Figure 16A:
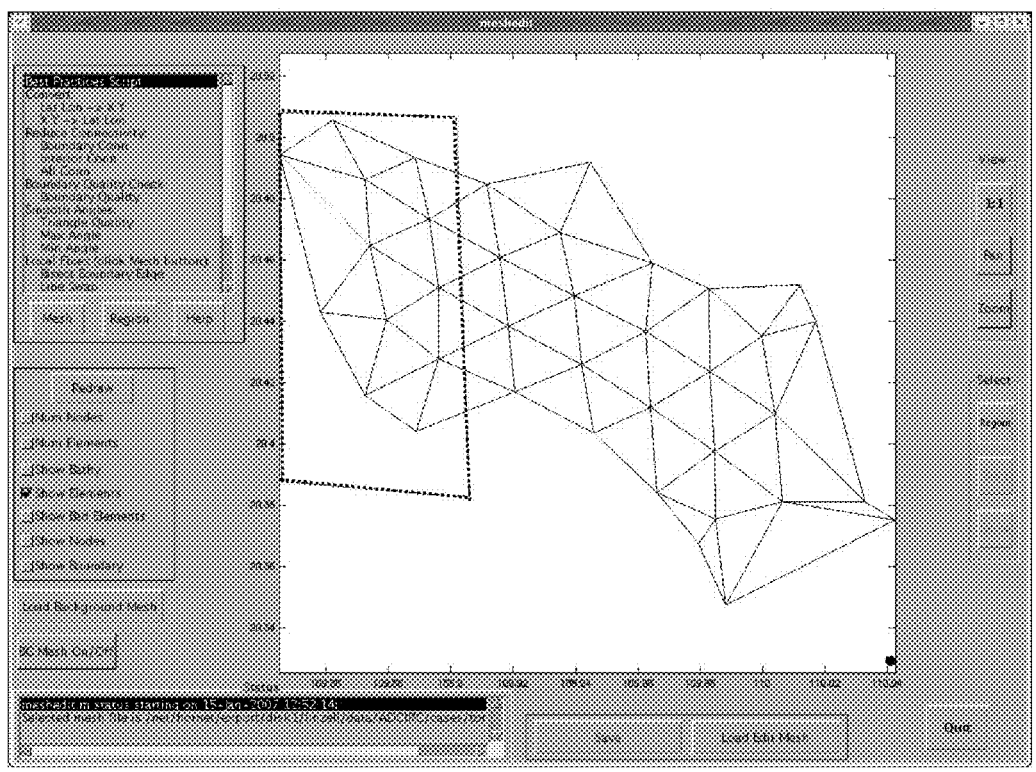
FIGS. 16A and 16B illustrate an exemplary application of a Split-4 mesh editing tool on a subset of a mesh in accordance with the present invention.
Figure 16B:
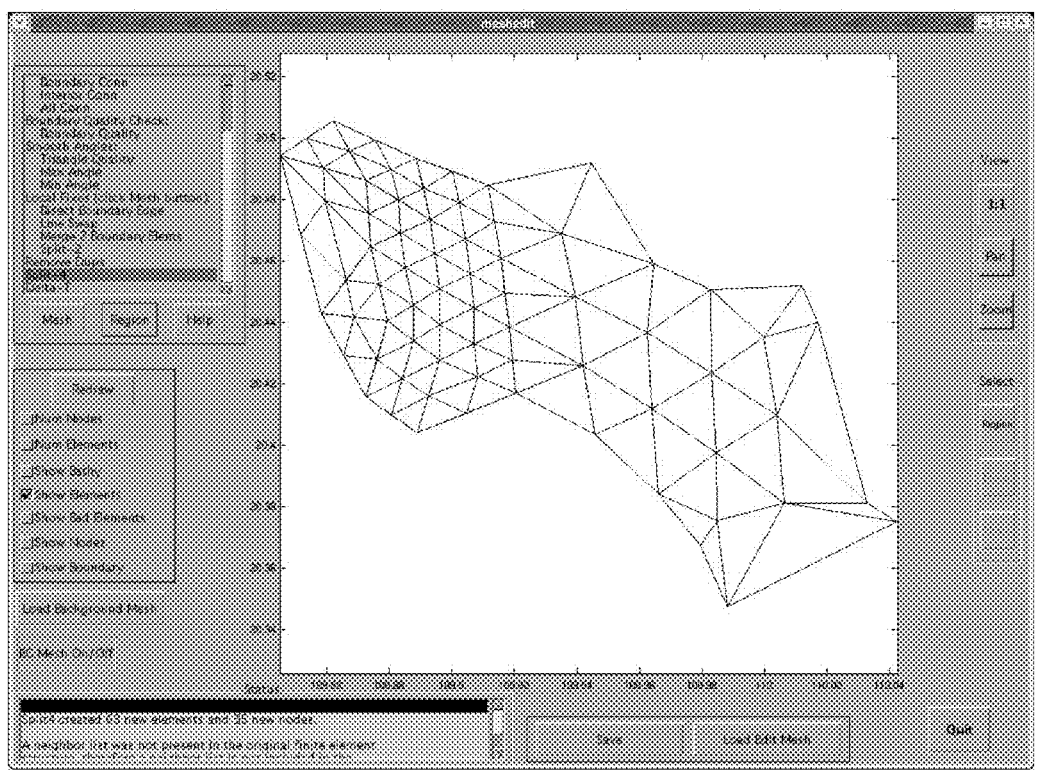

FIGS. 16A and 16B illustrate the application of Split-4 on a region of the mesh in accordance with this aspect of the present invention. FIG. 16A shows a display of a user-selected polygonal region within which the Split-4 operation in meshedit is applied. The user then can select the Split-4 option from the list of Mesh Operations and can click the "Region" button to activate this operation, and as shown in FIG. 16B, all elements within the region are split. In an exemplary embodiment illustrated by FIG. 16B, elements that cross the boundary of the region also can be split.

This operation is useful for adding elements in regions where a higher density is needed to resolve geometric features or increased mesh resolution is desired over the entire mesh. One common application is to import a rectangular, refined mesh created by meshcreate prior to cutting by the boundary information and refine areas that are not well-resolved by the bathymetric depth refinement criteria (e.g., deep, narrow channels or straits) using the Split-4 operation over a region. The mesh resulting from this application of Split-4 can be re-imported into meshcreate to complete the boundary cut. The result will be a mesh that better resolves the geometric features of interest at the desired resolution.

Delta-T

Figure 6B:
Figure 17:
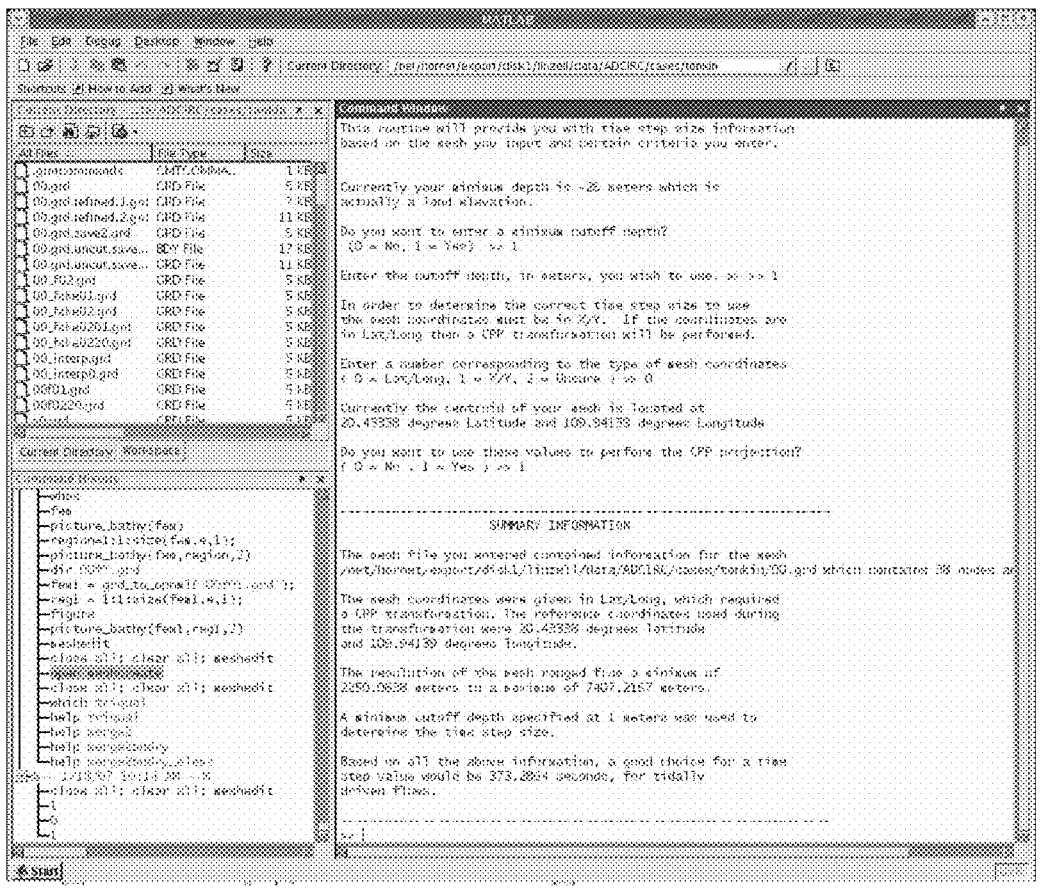
FIG. 17 depicts an exemplary application of a Delta-T mesh operation in accordance with the present invention.

An additional option in the list of available mesh operations in meshedit as shown in FIGS. 5 and 6B is Delta-T. The purpose of the Delta-T routine is to provide an estimate of the model time step required to meet a specified Courant-Friedrichs-Lewy (CFL) stability condition. The time step estimate assumes a tidal wave propagation speed equal to sqrt(gh) and requires satisfaction of a CFL condition of 0.6 or less over the entire mesh. The CFL is computed for this case as the tidal propagation speed multiplied by the time step and divided by the mesh spacing. Mesh spacing is estimated by the length of a triangle side assuming a triangle of the same area is equilateral. In an exemplary MATLAB®-implemented embodiment, user interaction for the Delta-T operation can be performed using a MATLAB® command window such as that shown in FIG. 17.

In the command window, the user is first prompted whether to enter a minimum cutoff depth. If the user chooses not to enter a minimum cutoff depth, the minimum depth of the mesh will be used.

Next, the coordinate system must be indicated. The calculations are performed in Cartesian (i.e., X/Y) coordinates, so if the mesh is in spherical (i.e., latitude/longitude) coordinates, they must be transformed. Thus, the user is prompted to indicate the coordinate system of the mesh and if the mesh is not in X/Y coordinates, is prompted to enter the coordinate system type. If the mesh is in spherical coordinates (0 is entered as shown), then the user is prompted for a central latitude and longitude which serves as the centroid of the coordinate transformation. If the user wishes to use a different location for the coordinate transformation, then 0 is entered, and the latitude and longitude values are entered as well:

Based on the information entered, calculations proceed and a summary of the mesh characteristics is provided. These characteristics can include the number of nodes, the number of elements, whether the mesh coordinates were given in X/Y form or some other form requiring a transformation, the depth resolution of the mesh, and a minimum cutoff depth used to determine a time step size. The Delta-T tool then can provide a suggested time step to be entered in an ADCIRC fort.15 file. The time step dictates the size of the time increment between equation solves in the computational model. For an explicit time stepping algorithm within the numerical model the size of the time step is governed by a Courant number less than 0.6.

The user should examine the summary information to ensure correctness, and note the suggested time step value. This time step value should be considered a maximum. In practice, the time step entered in an ADCIRC fort.15 file generally would be rounded down from the suggested value. For this example, a time step of 2.0 s might be used.

Display Options

As earlier noted, the meshedit GUI has several options available for the display of mesh features. The user can enable/disable the mesh display options by clicking the appropriate toggled check boxes in check box area 503 shown in FIG. 5. The available display options include the following features:

Num Nodes—node numbers are shown adjacent to their respective node

Num Elements—element numbers are displayed in the center of their respective element Show Bathy—color-filled contours of the mesh bathymetry Show Elements—mesh elements are delineated; this feature is enabled by default.

Show Bad Elements—bad or suspect quality elements, as determined by triangle quality or angle parameters, are marked Show Nodes—nodes are shown as small blue circles Show Boundary—mesh boundary is shown; display of the boundary is recommended, particularly if boundary elements or nodes have been modified, or if islands or other geographic features are to be displayed.

Figure 9B:
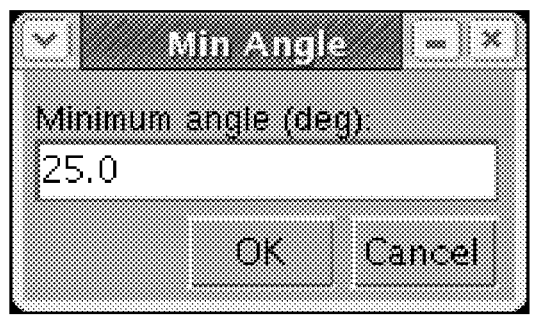

If Show Bad Elements is enabled, the user can be prompted to choose the criterion by which element quality is determined, such as triangle quality, maximum angle or minimum angle. If the user chooses "triangle quality," then a "triqual" input prompt such as that shown in FIG. 7D can be displayed. A selection of the "max angle" criterion results in display of a prompt for maximum angle input such as the prompt shown in FIG. 9A. Similarly if the user chooses "min angle", a minimum angle prompt such as that shown in FIG. 9B can be displayed. Once the user interaction is complete, the meshedit software scans the entire mesh for the user-selected criterion. Any "bad" elements that fall outside the bounds of the user-specified criteria can be marked, for example, with an asterisk symbol. Thus, in the exemplary mesh illustrated in FIG. 18, which also shows element and node numbers, elements 1801 and 1802 do not meet the user-specified element quality criteria and are marked by asterisks as shown in the Figure.

Show Bathy—Display Color-Filled Contours of the Mesh Bathymetry

Figure 19:
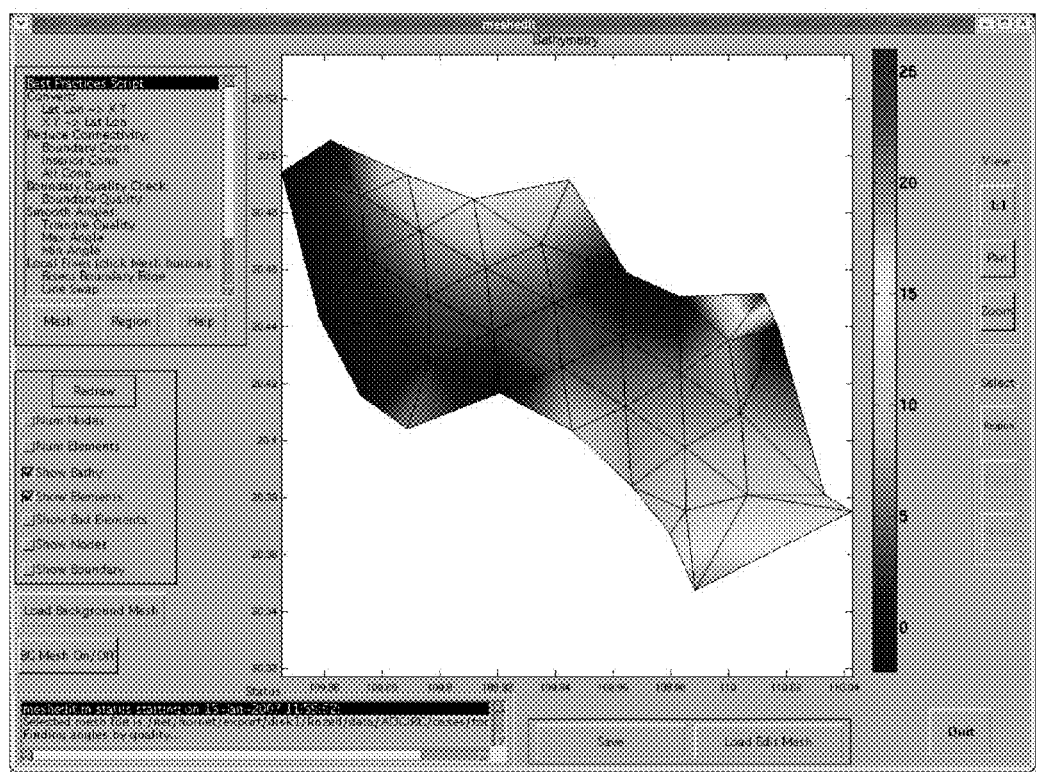
FIG. 19 depicts an exemplary mesh display using the Show Bathy mesh display option in accordance with the present invention.

An exemplary display in accordance with the "Show Bathy" option is shown in FIG. 19, where the color contours delineate different water depths prescribed at each nodal point in the mesh.

Displaying a Background Mesh—Load and Display an Existing Background Mesh.

Figure 20A:
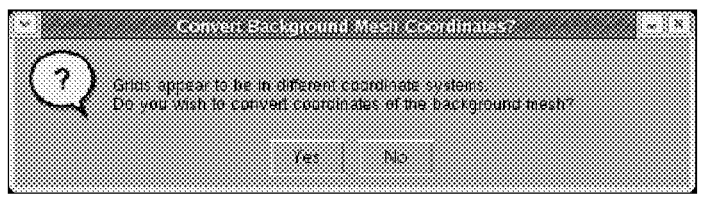
FIGS. 20A-20C depict aspects of a Show Background Mesh mesh display operation in accordance with the present invention.
Figure 20B:
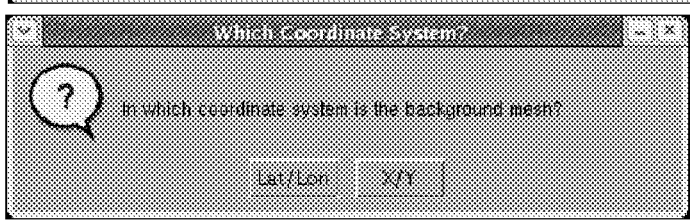

The creation of a background mesh was described above with respect to the mesh operation Interpolate Bathymetry. If the user clicks the Load Background Mesh button shown in FIG. 5, a file selection dialog box such as that shown in FIG. 5 can be displayed so that the user can select a file to load. The coordinate system of the background mesh can be determined, and if the coordinate system for the background mesh is different from that of the edit mesh, the user can be is prompted for a decision on converting the background mesh as shown in FIG. 20A. If the user chooses to convert the background mesh, the user can then be prompted to verify the background mesh coordinates as shown in FIG. 20B.

The coordinate choices for the background mesh are Lat/Lon and X/Y. Once the user selects the appropriate type of coordinates, and the coordinate conversion is applied, if necessary. The use can also choose not to convert the coordinate system of the background mesh, but this is typically done only if the user is certain that the background and edit meshes are represented in the same coordinate system.

Figure 20C:
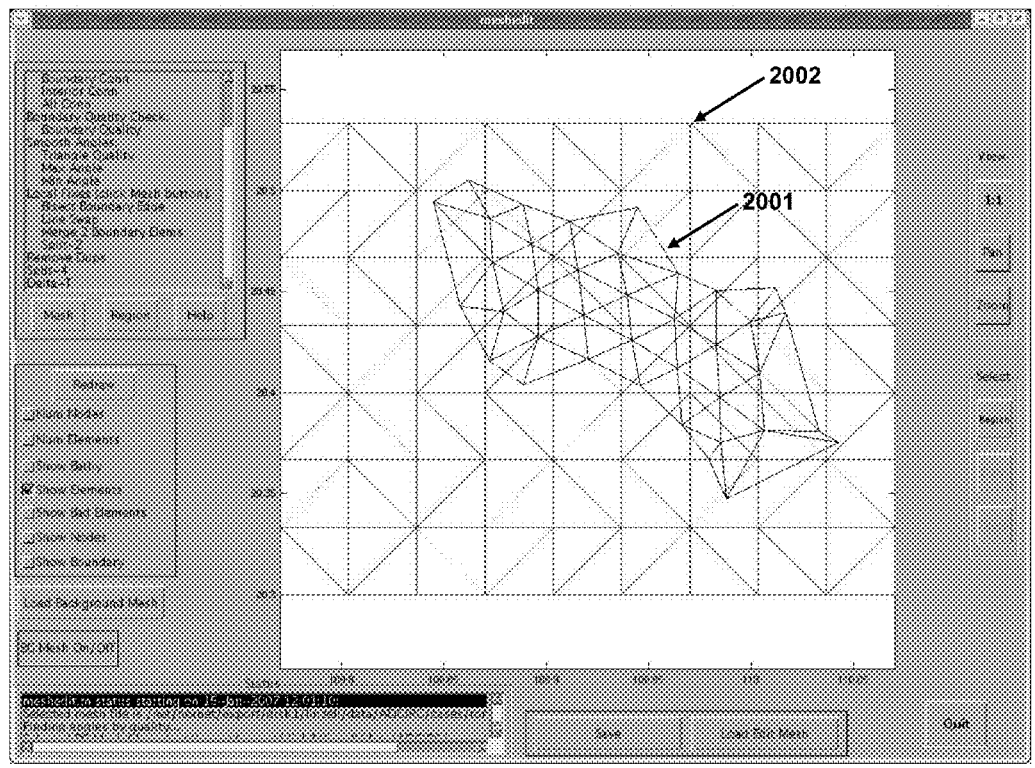

Following any necessary coordinate conversion, as illustrated in FIG. 20C, the edited mesh 2001 can be shown in the GUI together with the background mesh 2002. To aid in visualization, the edit mesh can be of a different color or line type (e.g., dashed) than the background mesh, and the coordinates of the plot area can be adjusted to display both meshes in their entirety.

Modifying the Mesh View—Display Controls for Zoom and Pan

Figure 21:
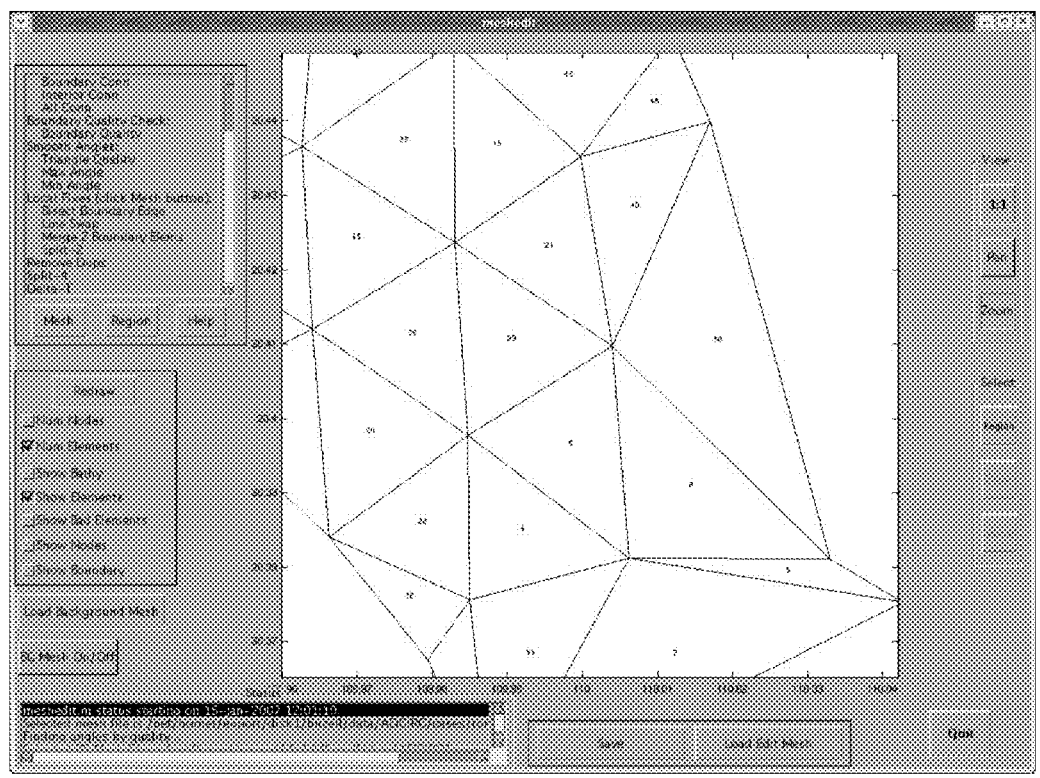
FIG. 21 depicts an exemplary mesh display using the Pan/Zoom mesh display operation in accordance with the present invention.

Meshedit View features (located along the right columnar panel of the GUI) permit the user to zoom into any region of the mesh, or pan the view to examine other portions of the mesh as desired. To activate this feature, the user can click Zoom button 504 shown in FIG. 5, and a small crosshair cursor can appears in the plot area. If the user clicks on a location in the plot area, the view is zoomed in with the center of the zoom region identified by the point location where the user clicked. If the user clicks in the plot area and moves mouse pointer while holding down the left mouse button (commonly referred to as "rubber banding"), the rectangular area traversed by the mouse pointer becomes the new zoomed-in region. FIG. 21 illustrates and exemplary view of a zoomed-in region of an edit mesh. Note the plot coordinates are adjusted to display the zoomed-in region.

If the user clicks Pan button 505 shown in FIG. 5, the visible region can be changed by the user clicking in the plot area and, while holding down the left mouse button, moving the mouse pointer in the direction opposite of the desired viewing area. This action has the effect of dragging the edit mesh so that the new region of interest is brought into view. For a large edit mesh or a view that has been zoomed, several successive pans (by repeatedly dragging with the mouse) may be required to bring into view the new region of interest. To reset the view to the entire mesh, the user can click 1:1 button 506 shown in FIG. 5. This button also can reset the view if toggling of the mesh display features results in an undesirable image.

The invention advances the art in unstructured mesh generation by providing a tool whereby robust unstructured meshes can be created in an efficient and automated fashion. The required level of knowledge of the user is limited to specification of coastal boundary and bathymetry data file names and the coarsest resolution to be in the final mesh and finest resolution as achieved through a specified number of refinements. The mesh generation automatically performs a range of element quality checks to increase the robustness and quality of the numerical solution computed over the mesh. Additional functionality allow for hand edits, visualization and assessment of the computational burden of a created mesh.

It should be noted that aspects of a method for mesh generation and mesh editing as described herein can be accomplished by one or more processors executing one or more sequences of one or more computer-readable program code read into a memory of one or more computers from non-volatile or volatile computer-readable media capable of storing and/or transferring computer programs or computer-readable instructions for execution by one or more computers. Non-volatile computer readable media that can be used can include a compact disk, hard disk, floppy disk, tape, magneto-optical disk, PROM (EPROM, EEPROM, flash EPROM), SRAM, SDRAM, or any other magnetic medium; punch card, paper tape, or any other physical medium such as a chemical medium. Volatile media can include a memory such as a dynamic memory in a computer.

Although particular embodiments, aspects, and features have been described and illustrated, it should be noted that the invention described herein is not limited to only those embodiments, aspects, and features. It should be readily appreciated that modifications may be made by persons skilled in the art. The present application contemplates any and all modifications within the spirit and scope of the underlying invention described and claimed herein, and such embodiments are also contemplated to be within the scope and spirit of the present disclosure.

What is claimed is:

1. A computer-implemented method for automatically generating a mesh for use in a coastal model, comprising:
receiving boundary data of at least one boundary associated with a geographic area covered by the mesh, the boundary data having a spatial coordinate system associated therewith;
receiving bathymetry data of a bathymetry associated with the geographic area covered by the mesh;
receiving selections governing the generating of the mesh;
automatically creating the mesh based on the boundary data, the bathymetry data, and the selections, the mesh having mesh element data of a plurality of initial mesh elements of the mesh, each of the initial mesh elements being associated with the geographic area in the mesh and having an initial size and an initial shape;
automatically refining the mesh based on the bathymetry data and the selections, the refining step including changing at least one of the initial size and the initial shape of at least one of the plurality of the initial mesh elements based on the bathymetry data;
automatically estimating a number of nodes in the mesh based on the selections;
automatically determining a number of processors needed to generate the refined mesh based on the number of nodes and the selections; and
automatically generating, by the processors, the refined mesh.

2. The method for automatically generating a mesh in accordance with claim 1, further including
receiving depth data of a user selection of a plurality of depths at which refinement of the mesh is to be made; and
refining the mesh in accordance with the depth data.

3. The method for automatically generating a mesh in accordance with claim 1, further including
receiving user data of a user selection of an initial mesh resolution and a number of desired refinements; and
refining the mesh in accordance with the user data.

4. The method for automatically generating a mesh in accordance with claim 1, wherein the generated mesh comprises a fort.14 input file.

5. A computer-implemented method for automatically editing a mesh for use in coastal modeling, comprising applying a master smoothing script to a mesh;

wherein the master smoothing script includes instructions automatically executed by the computer to cause the computer to edit the mesh to form an edited mesh having a boundary and a bathymetry of a geographic area associated with the edited mesh:
reduce nodal connectivity on all interior nodes in the edited mesh;
apply angle smoothing to the edited mesh a first time;
reduce nodal connectivity on all boundary nodes in the edited mesh;
apply angle smoothing to the edited mesh a second time;
apply at least one boundary element quality update to the edited mesh to modify a corresponding at least one boundary of the edited mesh;
reduce nodal connectivity on all nodes in the edited mesh; and
apply angle smoothing to the edited mesh a third time.

6. A computer program product comprising a non-transitory computer-usable medium having a computer-readable program code embodied therein, the computer-readable program code adapted to be executed to implement a method for generating a mesh for use in a coastal model, the method comprising:
providing a graphical user interface adapted to receive input from a user;
receiving boundary data from a user-identified boundary file, the boundary file including at least one boundary associated with a geographic area covered by the mesh, the boundary data having a spatial coordinate system associated therewith;
receiving bathymetry data from a user-identified bathymetry file, the bathymetry file including data associated with the geographic area;
receiving selections governing the generating of the mesh;
automatically creating the mesh based on the boundary data, the bathymetry data, and the selections, the mesh having mesh element data of a plurality of initial mesh elements of the mesh, each of the initial mesh elements being associated with the geographic area in the mesh, each of the initial mesh elements having an initial size and an initial shape;
automatically refining the mesh based on the bathymetry data, the refining step including changing at least one of the initial size and the initial shape of at least one of the plurality of the initial mesh elements based on the bathymetry data;
automatically estimating a number of nodes in the mesh based on the selections;
automatically determining a number of processors needed to generate the refined mesh based on the number of nodes and the selections; and
automatically generating, by the processors, the refined mesh.

7. The computer program product according to claim 6, wherein the computer-readable program code further is further adapted to implement mesh generation steps comprising:
receiving depth data of a user selection of a plurality of depths at which refinement of the mesh is to be made; and
refining the mesh in accordance with the depth data.

8. The computer program product according to claim 6, wherein the computer-readable program code further is further adapted to implement mesh generation steps comprising:
receiving user data of a user selection of an initial mesh resolution and a number of desired refinements; and
refining the mesh in accordance with the user data.

9. A computer program product comprising a non-transitory computer-usable medium having a computer-readable program code embodied therein, the computer-readable program code adapted to be executed to implement a method for editing a mesh for use in a coastal model, the method comprising:
applying a master smoothing script to a mesh, the master smoothing script including instructions automatically executed by the computer to edit the mesh to form an edited mesh having a boundary and a bathymetry of a geographic area associated with the edited mesh:
reduce nodal connectivity on all interior nodes in the edited mesh;
apply angle smoothing to the edited mesh a first time;
reduce nodal connectivity on all boundary nodes in the edited mesh;
apply angle smoothing to the edited mesh a second time;
apply at least one boundary element quality update to the edited mesh to modify a corresponding at least one boundary of the edited mesh;
reduce nodal connectivity on all nodes in the edited mesh; and
apply angle smoothing to the edited mesh a third time.

* * * * *